United States Patent
Honma

(10) Patent No.: US 10,127,104 B2
(45) Date of Patent: Nov. 13, 2018

(54) SEMICONDUCTOR MEMORY DEVICE AND MEMORY SYSTEM

(71) Applicant: TOSHIBA MEMORY CORPORATION, Tokyo (JP)

(72) Inventor: Mitsuaki Honma, Fujisawa Kanagawa (JP)

(73) Assignee: Toshiba Memory Corporation, Tokyo (JP)

(*) Notice: Subject to any disclaimer, the term of this patent is extended or adjusted under 35 U.S.C. 154(b) by 0 days.

(21) Appl. No.: 15/280,264

(22) Filed: Sep. 29, 2016

(65) Prior Publication Data

US 2017/0255514 A1 Sep. 7, 2017

(30) Foreign Application Priority Data

Mar. 1, 2016 (JP) .................... 2016-038942

(51) Int. Cl.
 *G06F 11/10* (2006.01)
 *G06F 3/06* (2006.01)
 (Continued)

(52) U.S. Cl.
 CPC .......... *G06F 11/1068* (2013.01); *G06F 3/064* (2013.01); *G06F 3/0619* (2013.01); *G06F 3/0634* (2013.01); *G06F 3/0647* (2013.01); *G06F 3/0659* (2013.01); *G06F 3/0679* (2013.01); *G06F 11/1048* (2013.01); *G11C 7/1063* (2013.01); *G11C 16/10* (2013.01); *G11C 16/16* (2013.01); *G11C 16/26* (2013.01);
 (Continued)

(58) Field of Classification Search
 CPC ............. G06F 11/1076; G06F 11/1068; G06F 3/0619; G06F 3/064; G06F 3/0634; G06F 12/0246; G06F 3/0618
 See application file for complete search history.

(56) References Cited

U.S. PATENT DOCUMENTS 7,852,675 B2 12/2010 Maejima
8,233,323 B2 7/2012 Hishida et al.
(Continued)

FOREIGN PATENT DOCUMENTS

JP 2010009102 A 1/2010

OTHER PUBLICATIONS

Approval Decision Letter dated Jun. 9, 2017, mailed in Taiwan counterpart Application No. 105121011, 6 pages (with translation).

*Primary Examiner* — Shelly A Chase
(74) *Attorney, Agent, or Firm* — Patterson & Sheridan, LLP

(57) ABSTRACT

A memory system includes a semiconductor memory device having a memory cell array including a first area and a second area, and a controller configured to issue to the semiconductor memory device a first command designating reading of data from the first area using a first data reading scheme and a flag status associated with the data. If the flag status indicates the data is in a first state, the controller issues the second command to cause the data to be output from the semiconductor memory device to the controller. If the flag status indicates the data is in a second state, the controller issues the third command to cause the data to be transferred from the first area to the second area.

7 Claims, 18 Drawing Sheets

(51) Int. Cl.
*G11C 16/10* (2006.01)
*G11C 16/16* (2006.01)
*G11C 16/26* (2006.01)
*G11C 29/52* (2006.01)
*G11C 7/10* (2006.01)
*G11C 29/02* (2006.01)
*G11C 16/04* (2006.01)
*G11C 29/04* (2006.01)

(52) U.S. Cl.
CPC .......... *G11C 29/021* (2013.01); *G11C 29/028* (2013.01); *G11C 29/52* (2013.01); *G11C 16/0483* (2013.01); *G11C 2029/0409* (2013.01); *G11C 2029/0411* (2013.01)

(56) References Cited

U.S. PATENT DOCUMENTS

| | | |
|---|---|---|
| 8,271,853 B2 | 9/2012 | Kanai et al. |
| 8,372,720 B2 | 2/2013 | Fukuzumi et al. |
| 8,381,072 B2 | 2/2013 | Kanai et al. |
| 8,514,627 B2 | 8/2013 | Itagaki et al. |
| 8,952,426 B2 | 2/2015 | Maejima |
| 9,124,300 B2 | 9/2015 | Sharon et al. |
| 9,223,649 B2 | 12/2015 | Bisen |
| 2011/0284946 A1 | 11/2011 | Kiyotoshi |
| 2012/0023283 A1* | 1/2012 | Yang ................... G06F 12/0246 711/103 |
| 2013/0080858 A1* | 3/2013 | Lee ........................ G11C 16/26 714/773 |
| 2015/0074490 A1 | 3/2015 | Kondo |
| 2015/0261605 A1 | 9/2015 | Yamauchi |

\* cited by examiner

FIG. 6

SLC read error correction status for xxh

| | DQ0 | DQ1 | DQ2 | DQ3 | DQ4 | DQ5 | DQ6 | DQ7 |
|---|---|---|---|---|---|---|---|---|
| Definition of value | Error correction flag | Not used | Not used | Not used | Not used | Not used | Not used | Busy:"0" Ready:"1" |

Example of transferring SLC read data (Error correction flag = 0)

FIG. 16

SLC read shift read status for yyh

| | DQ0 | DQ1 | DQ2 | DQ3 | DQ4 | DQ5 | DQ6 | DQ7 |
|---|---|---|---|---|---|---|---|---|
| Definition of value | Shift read flag | Not used | Not used | Not used | Not used | Not used | Not used | Busy: "0" Ready: "1" |

SEMICONDUCTOR MEMORY DEVICE AND MEMORY SYSTEM

CROSS-REFERENCE TO RELATED APPLICATION

This application is based upon and claims the benefit of priority from. Japanese Patent Application No. 2016-038942; filed Mar. 1, 2016, the entire contents of which are incorporated herein by reference.

FIELD

Embodiments described herein relate generally to a semiconductor memory device and a memory system.

BACKGROUND

A memory system including a semiconductor memory device and a controller is known in which the semiconductor memory device is provided with a cache area having memory cells that each store one-bit data and a storage area having memory cells that each store two-bit or more data.

DESCRIPTION OF THE DRAWINGS

FIG. 6 is a status read result when performing the first write operation in the memory system according to the first embodiment.

FIG. 16 is a status read result when performing the first write operation in the memory system according to the second embodiment.

DETAILED DESCRIPTION

Figure 1:
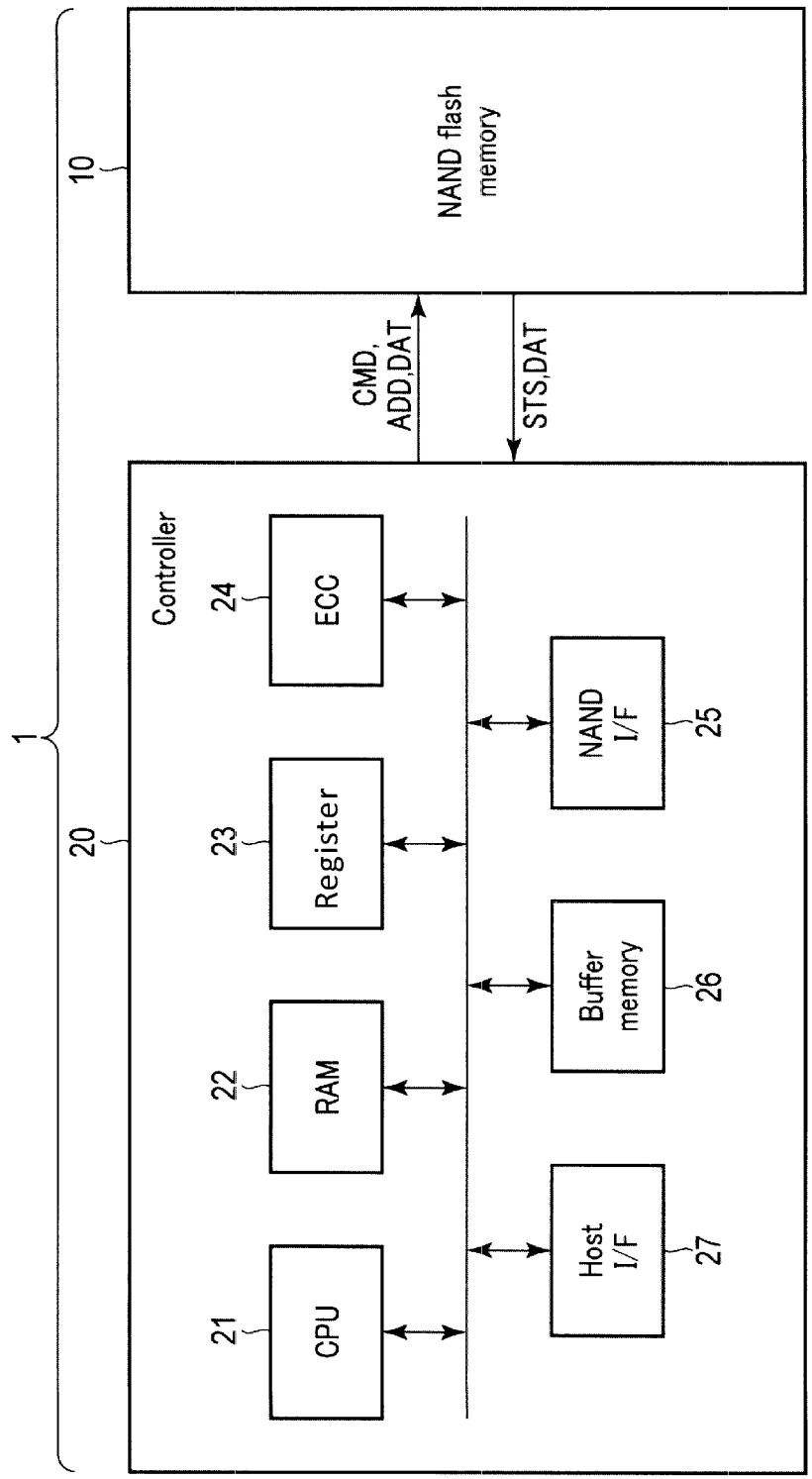
FIG. 1 is a block diagram of a memory system according to a first embodiment.

In general, according to one embodiment, a memory system includes a semiconductor memory device having a memory cell array including a first area and a second area, and a controller configured to issue to the semiconductor memory device a first command designating reading of data from the first area using a first data reading scheme and a flag status associated with the data. If the flag status indicates the data is in a first state, the controller issues the second command to cause the data to be output from the semiconductor memory device to the controller. If the flag status indicates the data is in a second state, the controller issues the third command to cause the data to be transferred from the first area to the second area.

Hereinafter, example embodiments will be described with reference to the accompanying drawings. In the following description, common reference numerals for elements in different figures are given to those elements having the same function and the same configuration.

1. First Embodiment

Hereinafter, a semiconductor memory device and a memory system according to a first embodiment will be described.

1-1. Configuration of Memory System 1

First, the configuration of the memory system will be described in conjunction with FIG. 1. FIG. 1 illustrates a block diagram of the memory system 1. As illustrated in FIG. 1, the memory system 1 is provided with a semiconductor memory device 10 and a controller 20.

The semiconductor memory device 10 is a NAND-type flash memory that stores data in a nonvolatile manner. Details of the configuration of the semiconductor memory device 10 will be described later.

The controller 20 commands the read, write, or erase of the data from/to the semiconductor memory device 10, in response to a command from an external host device. The controller 20 manages the memory space of the semiconductor memory device 10. As illustrated in FIG. 1, the controller 20 is provided with a processor (CPU) 21, an embedded memory (RAM) 22, a register 23, an ECC circuit 24, a NAND interface circuit 25, a buffer memory 26, and a host interface circuit 27.

The processor 21 controls the overall operation of the controller 20. For example, the processor 21 issues a write command, using the NAND interface, in response to the write command received from the host device. This operation is similar when reading and erasing.

The embedded memory 22 and the register 23 are, for example, a semiconductor memory such as DRAM, and are used as the work area of the processor 21. The embedded memory 22 retains firmware, various management tables, or the like, for operations of the semiconductor memory device 10. The register 23 retains an error correction flag received from the semiconductor memory device 10 when performing the write operation to the cache area.

The ECC circuit 24 performs an error checking and correcting (ECC) process of the data. More specifically, the ECC circuit 24 generates, for example, a parity bit based on the write data when data is being written to the semiconductor memory device 10. The ECC circuit 24 generates the parity bit, detects an error, and corrects the detected error when the data is read.

The NAND interface circuit 25 is connected to the semiconductor memory device 10, and handles communications with the semiconductor memory device 10. For example, the NAND interface circuit 25 sends a command CMD, address information ADD, and data DAT to the semiconductor memory device 10 in accordance with an instruction of the processor 21. The NAND interface circuit 25 receives status information STS and data DAT from the semiconductor memory device 10. The status information STS includes an error correction flag or ready/busy information, for example. Details of the error correction flag and the ready/busy information will be described later.

The buffer memory 26 temporarily retains data received from the semiconductor memory device 10 and the host device by the controller 20.

The host interface circuit 27 is connected to the host device via a host bus (not specifically illustrated), and handles communications with the host device. For example, the host interface circuit 27 respectively transfers the command and the data received from the host device to the processor 21 and the buffer memory 26.

The processor 21 may have or incorporate the function of the ECC circuit 24. The embedded memory 22 and the register 23 may be a single semiconductor memory unit/module. In addition, the number of the signal lines (I/O lines, see FIG. 2) included in a NAND bus is not limited and can be changed.

1-1-1. Configuration of Semiconductor Memory Device 10

Figure 2:
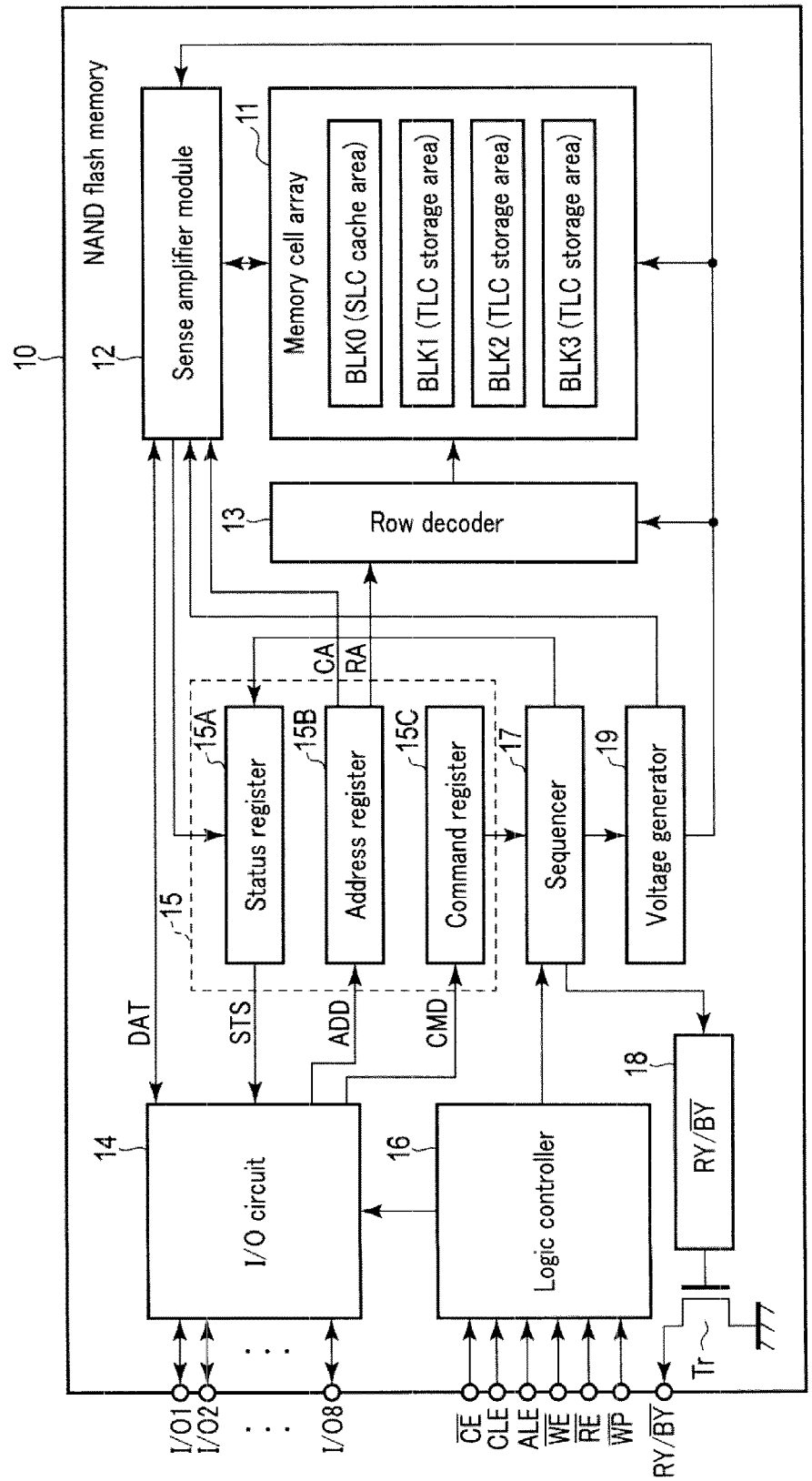
FIG. 2 is a block diagram of a semiconductor memory device provided in the memory system according to the first embodiment.

Next, the configuration of the semiconductor memory device 10 will be described based on FIG. 2. FIG. 2 illustrates a block diagram of the semiconductor memory device 10. As illustrated in FIG. 2, the semiconductor memory device 10 is provided with a memory cell array 11, a sense amplifier module 12, a row decoder 13, an input-output (I/O) circuit 14, registers 15, a logic controller 16, a sequencer 17, a ready/busy control circuit 18, and a voltage generator 19.

The memory cell array 11 is provided with a plurality of blocks BLK. The blocks BLK0 to BLK3 from among the plurality of blocks BLK are illustrated in FIG. 2, as an example. The blocks BLK include a plurality of nonvolatile memory cells that are associated with bit lines and word lines, and each block BLK is, for example, a data erase unit. In the semiconductor memory device 10, the block BLK0 is used as the cache area, and the blocks BLK1 to BLK3 are used as the storage area, for example.

The cache area is a memory area that is used to temporarily retain the write data. A single-level cell (SLC) scheme by which one-bit data is stored in a memory cell is applied to the cache area (e.g., block BLK0) and is used, for example, to quickly store incoming data before the data is ultimately transferred to long term storage in another portion of the memory cell array 11. The storage area is a memory area that has a larger memory capacity per unit area than that of the cache area, and can be considered a longer term data storage area than the cache area. A multi-level cell (MLC) scheme by which two-bit (or more) data is stored in the memory cells of the memory array 11 is applied to the storage area (e.g., blocks BLK1 to BLK3). In terms of the writing of data at a high speed, the cache area is superior to the storage area. In contrast, in terms of data density, the storage area is superior to the cache area.

Therefore, when the write command including the data to be written to the NAND flash memory 10 is received from the controller 20, the data might be temporarily written in the cache area. Then, this data written to the cache area is subsequently transferred to the storage area at another time (for example, during an idle time). Accordingly, the writing of the data at a high speed and high capacity storage are compatible with each other in the NAND flash memory 10 adopting a configuration with a cache area and storage areas as described above.

In this present embodiment, a case where a triple-level cell (TLC) scheme by which three-bit data is stored in the memory cell of the storage area is used and will be described as a non-limiting example.

The sense amplifier module 12 reads the data DAT from the memory cell array 11 and outputs the data DAT to the controller 20 via the I/O circuit 14 as necessary. The sense amplifier module 12 also transfers the write data DAT that is received from the controller 20 via the I/O circuit 14 to the memory cell array 11.

The row decoder 13 selects word lines corresponding to the memory cells that are to be subjected to the reading and the writing. The row decoder 13 applies desired voltages to the selected word lines and the non-selected word lines.

The I/O circuit 14 receives the command CMD, the address information ADD, and the write data DAT from the controller 20 and transfers the command CMD, the address information ADD, and the write data DAT to a command register 15C, an address register 15B, and the sense amplifier module 12, respectively. The I/O circuit 14 sends status information STS and the read data DAT, that are transferred from a status register 15A and the sense amplifier module 12, to the controller 20. These input and output (I/O) signals are sent and received via, for example, eight input-output terminals I/O1 to I/O8. The signal lines through which the data signals are sent and received are hereinafter referred to as signal lines DQ0 to DQ7, respectively.

The register 15 includes the status register 15A, the address register 15B, and the command register 15C. The status register 15A retains the status information STS. In addition, the status register 15A transfers the status information STS to the I/O circuit 14 in accordance with the instruction of the sequencer 17. The address register 15B retains the address information ADD. In addition, the address register 15B transfers a column address signal CA and a row address signal RA included in the address information ADD to the sense amplifier module 12 and the row decoder 13, respectively. The command register 15C retains the command CMD. In addition, the command register 15C transfers the command CMD to the sequencer 17.

The logic controller 16 receives various control signals from the controller 20, and controls the I/O circuit 14 and the sequencer 17. As the control signals, for example, a chip enable signal/CE, a command latch enable signal CLE, an address latch enable signal ALE, a write enable signal/WE, a read enable signal/RE, and a write protect signal/WP are used. The signal/CE is a signal for enabling the semiconductor memory device 10. The signals CLE and ALE are signals indicating that the input signals to the I/O circuit 14 are a command signal or an address signal, respectively. The signals/WE and/RE are signals indicating signals are to be input or output, respectively, via the input-output terminals I/O1 to I/O8. The signal/WP is a signal for protecting the semiconductor memory device 10 when, for example, the power supply is turned-on or turned-off.

The sequencer 17 controls the operations of the semiconductor memory device 10. More specifically, the sequencer 17 executes the write operation and the read operation, or the like, by controlling the sense amplifier module 12, the row decoder 13, and the voltage generator 19 based on the command CMD transferred from the command register 15C.

The ready/busy control circuit 18 generates a ready/busy signal RY/(/BY) based on the operation state of the sequencer 17 and sends the signal to the controller 20. The signal RY/(/BY) is a signal notifying whether or not the semiconductor memory device 10 is in a ready state (a state where the command can be received from the controller 20), or in a busy state (a state where the command cannot be received from the controller 20) to the controller 20. In addition, the ready/busy control circuit 18 controls the transistor Tr that is connected to the output thereof to be turned-on or turned-off, and thus the signal RY/(/BY) is generated. For example, the signal RY/(/BY) becomes "L" level when the semiconductor memory device 10 performs the read operation or the like of the data (busy state), and becomes "H" level when the operation ends (ready state).

The voltage generator 19 generates a voltage that is suitable for operation of the memory cell array 11, the sense amplifier module 12, and the row decoder 13.

The total number of the blocks BLK provided in the memory cell array 11 is not particularly limited, and may be any number. In addition, of the plurality of blocks BLK, the number of the blocks BLK that are assigned to the cache area and the number of the blocks BLK that are assigned to the storage area are not particularly limited, and may be any number.

In some embodiments, the controller 20 need not use the ready/busy control circuit 18 as means for recognizing the operation state of the semiconductor memory device 10. In such cases, the sequencer 17 stores the ready/busy information corresponding to the ready/busy signal in the status register 15A. Then, when the controller 20 issues a status read command, the ready/busy information is read from the status register 15A and output from the I/O circuit 14. Accordingly, the controller 20 can recognize the operation state of the semiconductor memory device 10 without the separate, continuous provision of a ready/busy signal.

1-1-2. Configuration of Block BLK

Figure 3:
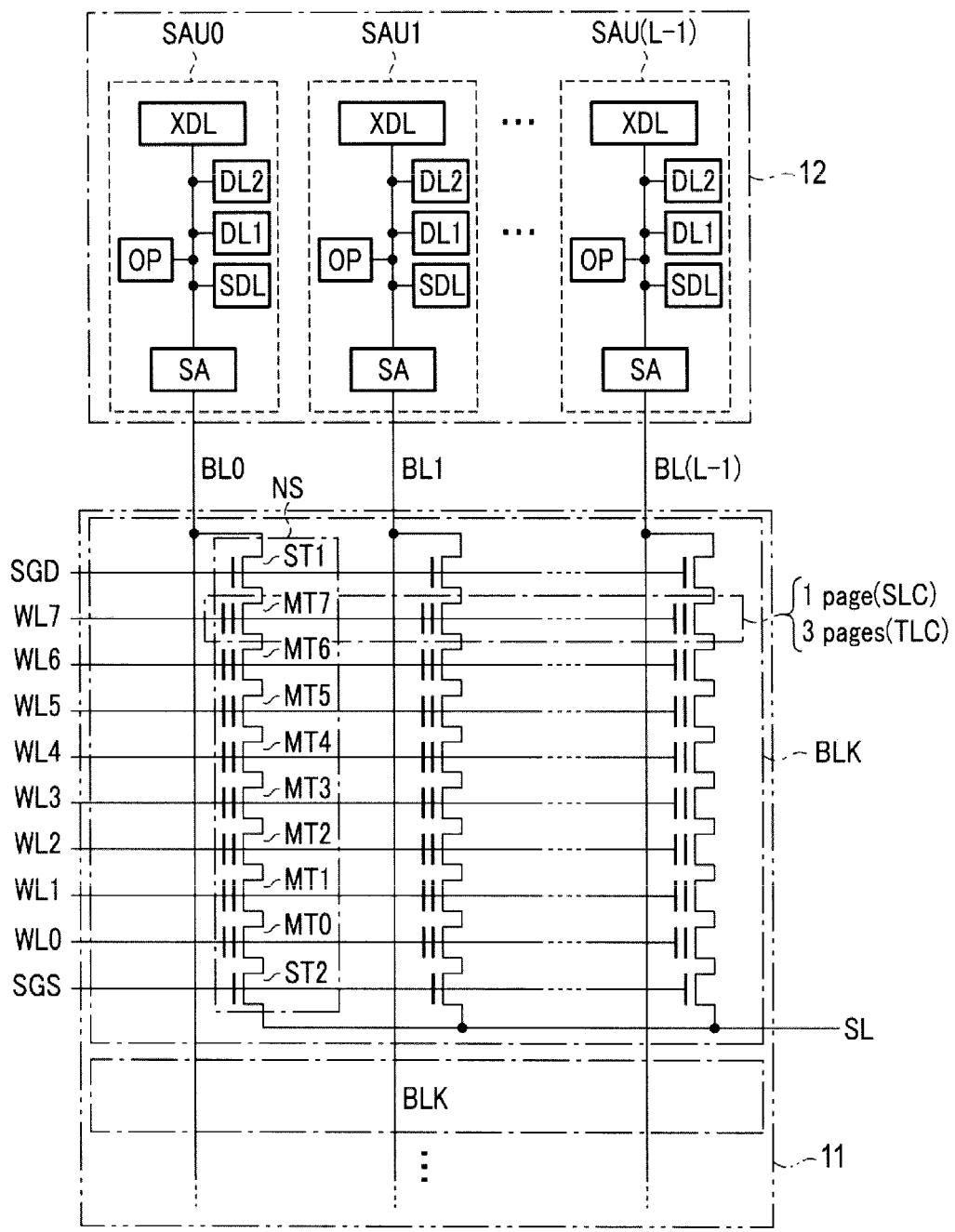
FIG. 3 is a circuit diagram of a memory cell array and a sense amplifier module included in the semiconductor memory device that is provided in the memory system according to the first embodiment.

Next, the configuration of the blocks BLK will be described based on FIG. 3. FIG. 3 illustrates a circuit diagram of a block BLK and a sense amplifier module 12. As illustrated in FIG. 3, the block BLK is provided with a plurality of NAND strings NS.

Each of the NAND strings NS is disposed to correspond to one of the bit lines BL0 to BL (L−1), where (L−1) is a natural number of one or more. Each NAND string NS includes, for example, eight memory cell transistors MT (MT0 to MT7) and selection transistors ST1 and ST2.

The memory cell transistors MT are provided with a control gate and a charge storage layer, and function to retain data in a nonvolatile manner. The memory cell transistors MT are connected in series between the source of the selection transistor ST1 and the drain of the selection transistor ST2. The gates of the selection transistors ST1 and ST2 in the same block are connected to selection gate lines SGD and SGS, respectively. Similarly, the control gates of the memory cell transistors MT0 to MT7 in the same block are connected to the word lines WL0 to WL7, respectively.

The drain of the selection transistor ST1 of each NAND string NS in the same column of the memory cell array 11 is connected to the same bit line BL. In other words, the bit line BL is connected to the NAND string NS in the same column of the plurality of blocks BLK. Furthermore, the source of each of the selection transistors ST2 are connected to a source line SL.

In the configuration described above, a set of one-bit data retained in the plurality of the memory cells that are connected to a common word line WL is referred to as a "page." Accordingly, when the SLC scheme is applied, the data of one page can be stored in a set of the memory cells connected to one word line WL. On the other hand, when the TLC scheme is applied, each memory cell can retain three-bit data, and thus the data of three pages (three pages: an upper page, a middle page, and a lower page) can be stored in the memory cells connected to the one word line WL.

In other words, a "page" may also be considered to describe a part of the memory space corresponding to memory cells connected to the same word line. The writing and the reading of the data may be performed for each page (this scheme is referred to as a page-by-page reading/writing process). In this case, whenever the data of one page is written or read, the controller 20 issues a command to the semiconductor memory device 10.

Alternatively, the writing and the reading of the data may be performed for each of the word lines WL. In this case, an operation similar to the SLC scheme is used when the writing and the reading of the data are performed for each page. However, when the TLC scheme is applied, the data of three pages that is being assigned to one word line WL is collectively written or read by a single command input (this scheme is referred to as a sequential reading/writing process).

Hereinafter, although the case of page-by-page reading/writing will be described as an example, the embodiments described herein can also be applied to the case of the sequential reading/writing.

In the configuration, the number of the memory cell transistors MT included in one NAND string NS is not limited to that depicted in the figures, and may be any number.

1-1-3. Configuration of Sense Amplifier Module 12

Next, the configuration of the sense amplifier module 12 will be described based on FIG. 3. As illustrated in FIG. 3, the sense amplifier module 12 is provided with sense amplifier sections SAU (SAU0 to SAU (L−1)) that are respectively disposed for each of the bit lines BL. The sense amplifier section SAU includes a sense amplifier SA, latch circuits SDL, DL1, DL2, and XDL, and a calculation operation section OP. The sense amplifier SA, the latch circuits SDL, DL1, DL2, and XDL, and the calculation operation section OP are connected with each other so as to allow the data to be sent and received therebetween.

When the reading, the sense amplifier SA senses the data that is read on the corresponding bit line BL, and determines whether or not the read data is "0" or "1". When the writing, the sense amplifier SA applies a voltage to the bit line BL based on the value of write data.

The latch circuits SDL, DL1, and DL2 temporarily retain the read data and the write data. For example, the outgoing read data that is determined by the sense amplifier SA when reading and the incoming write data can be transferred to the latch circuit XDL transferred to/from any one of the latch circuits SDL, DL1, and DL2.

The latch circuit XDL is used for input and output the data between the sense amplifier section SAU and the controller 20. That is, the data received from the controller 20 is transferred to the latch circuit SDL, DL1, or DL2, or the sense amplifier SA via the latch circuit XDL. In addition, the data of the latch circuit SDL, DL1, or DL2, or the sense amplifier SA is transferred to the controller 20 via the latch circuit XDL.

The calculation operation section OP performs various logical operations, such as a logical product (AND) operation, a NOT-AND (NAND) operation, a logical sum (OR) operation, a NOT-OR (NOR) operation, an exclusive NOR (XNOR) operation, or the like, based on the data retained in the latch circuits SDL, DL1, and DL2.

The number of the latch circuits provided in the sense amplifier section SAU is not particularly limited. For example, the number of the latch circuits may be determined based on the number of bits that are stored in each memory cell. In addition, the calculation operation section OP need not be disposed in the sense amplifier section SAU. In this case, the function of the calculation operation section OP can be realized in the data transfer between the latch circuits SDL, DL1, and DL2, for example.

1-2. Write Operation 1-2-1. Outline of Write Operation

Figure 4:
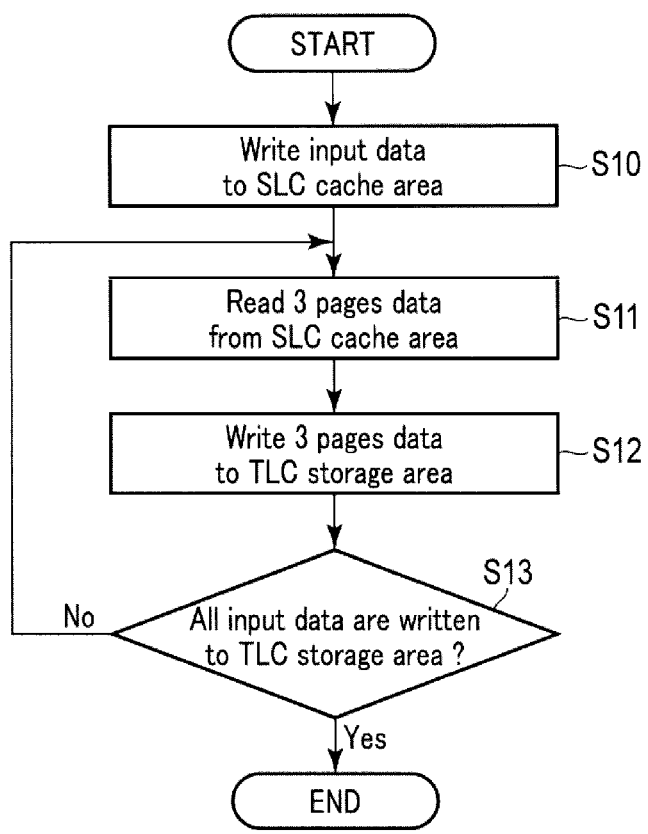
FIG. 4 is a flowchart of a write operation in the memory system according to the first embodiment.

Next, an outline of the write operation of the memory system 1 will be described based on FIG. 4. FIG. 4 illustrates a flowchart of the write operation of the memory system 1.

First, the input data sent from the controller 20 is written to the cache area of the semiconductor memory device 10 using the SLC scheme (step S10). Next, the data of three pages that has been written in the cache area in step S10 is read from the cache area (step S11). Here, the number of pages to be read from the cache area is set based on the writing scheme that is being applied to the storage area, and corresponds to the number of bits of the data that can be stored in each memory cell of the storage area. In the case of the present embodiment, the TLC scheme is applied to the storage area, and thus the data of three pages is read from the cache area.

Next, data of three pages that was read from the cache area in step S11 is written to the storage area using the TLC scheme (step S12).

Next, there is a check as to whether all of the input data sent from the controller 20 has been written to the storage area (step S13). When all of the input data has not been written to the storage area (No in step S13), the process returns to step S11, and the writing process of the remaining input data is performed. In this case, when the amount of the remaining input data is less than the amount of three pages, the semiconductor memory device 10 reads the data of remaining pages from the cache area, and writes the remaining data to the storage area using the TLC scheme. On the other hand, when all of the input data have been written to the storage area (Yes in step S13), the write operation ends.

As described above, in the write operation of the memory system 1, the semiconductor memory device 10 first writes the data that is input from the controller 20 to the cache area. After the writing to the cache area ends, the semiconductor memory device 10 reads the data from the cache area and writes it again, this time to the storage area.

In the operation described above, the writing of the data in the step S10 is referred to as a first write operation, and the steps S11 and S12 are referred to as a second write operation. Details of these operations will be described in the following.

1-2-2. First Write Operation 1-2-2-1. Details of First Write Operation

Figure 5:
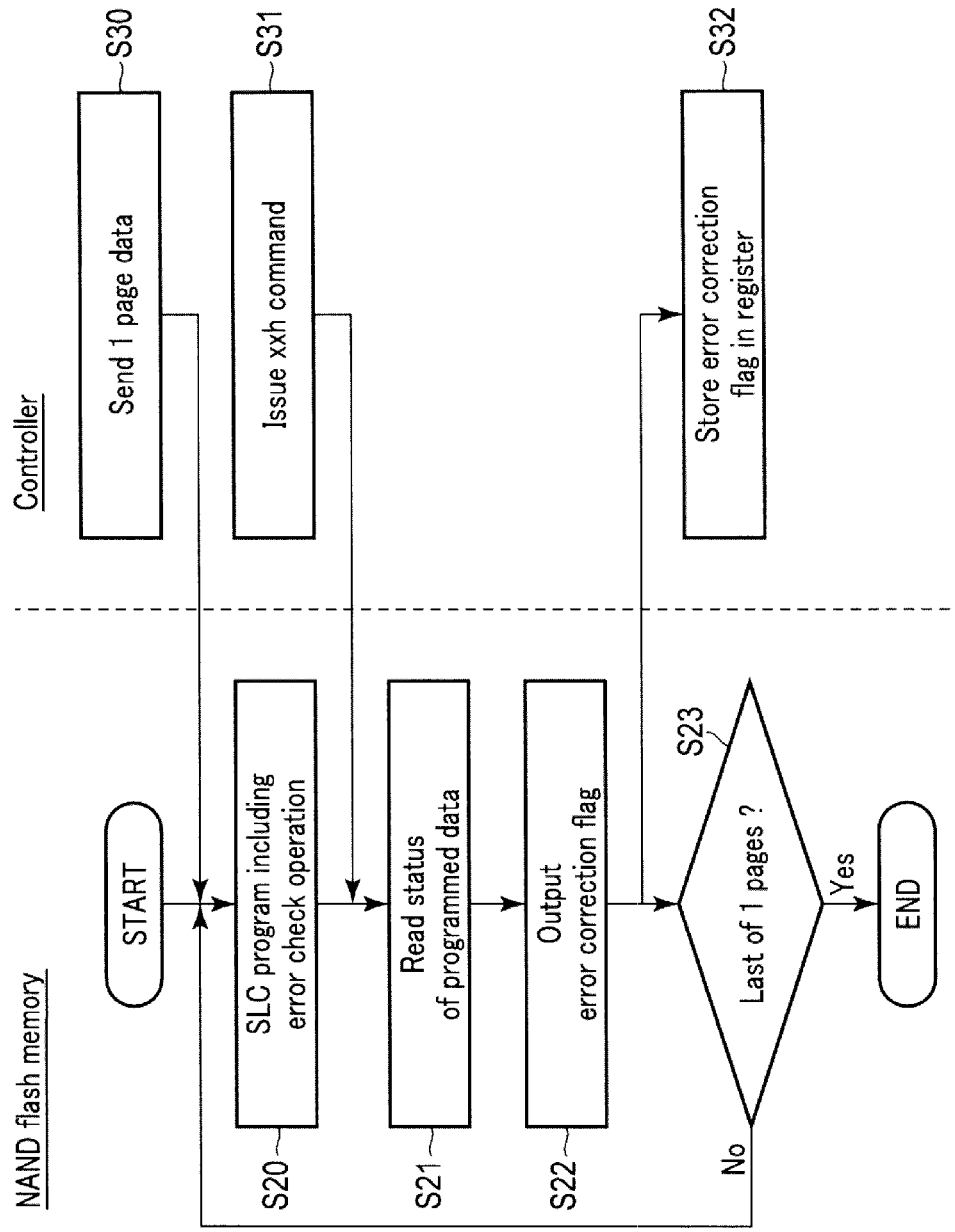
FIG. 5 is a flowchart of a first write operation in the memory system according to the first embodiment.

First, details of the first write operation will be described based on FIG. 5. FIG. 5 illustrates a flowchart of the first write operation.

As illustrated in FIG. 5, first, the controller 20 sends the write command, the address, and the data of one page to the semiconductor memory device 10 (step S30). Then, in the semiconductor memory device 10 that receives these signals, the sequencer 17 writes the received data (of one page) to the memory cells in the cache area using the SLC scheme by controlling the sense amplifier module 12 and the row decoder 13, or the like (step S20). This write operation using the SLC scheme in step S20 also includes an error check operation performed on the just written data. The error check operation determines whether or not a write error has occurred in the transfer of data to the cache area by reading the just written data and comparing this just written data as read to the (instructed) write data still retained in the sense amplifier module. Details of this error check operation will be described later.

After the step S20, when the semiconductor memory device 10 transitions from the busy state to the ready state, the controller issues a status read command "xxh" (step S31), and the status read command is retained in the command register 15C of the semiconductor memory device 10. The command "xxh" is a commands the reading of the status information including the error correction flag. When the command "xxh" is stored in the register 15C, the sequencer 17 reads the status information including the error correction flag from the status register 15A (step S21).

The status information that is read in step S21 will be described in conjunction with FIG. 6. As illustrated in FIG. 6, the status information is eight-bit data, and includes the error correction flag and the ready/busy information. That is, the error correction flag is retained in the most significant bit of the eight-bit data, and the ready/busy information is retained in the least significant bit of the eight-bit data. In the present example, although the bits from second bit to seventh bit are not used, other information could be included in these bits.

The error correction flag is "0" when error correction of the target page data is unnecessary, and is "1" when the error correction of the target page data is necessary, for example. The ready/busy information indicates whether or not the semiconductor memory device 10 can receive further commands from the controller 20, and is "0" when the semiconductor memory device 10 is in a busy state, and is "1" when the semiconductor memory device 10 is in a ready state, for example.

The eight-bit data is associated with the signal lines DQ0 to DQ7 in order from the most significant bit, and is output to the controller 20 using the signal lines (step S22). Then, the controller 20 stores the error correction flag included in the received status information in the register 23 as a part of a table (step S32).

Figure 7:
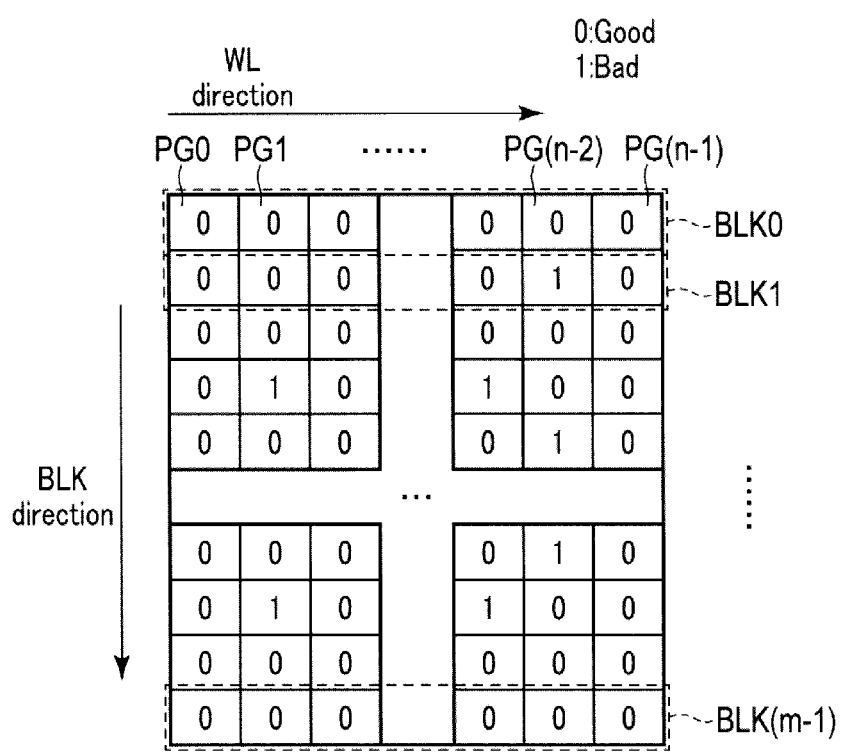
FIG. 7 is a data table of error correction flag information that is stored in a controller provided in the memory system according to the first embodiment.

The table generated for the error correction flag in step S32 will be described based on FIG. 7. FIG. 7 is a conceptual diagram of the table, and illustrates the error correction flags of the cache area of the memory cell array 11 when the cache area is provided with m blocks BLK (where m is a natural number of one or more), each of which respectively includes n pages PG (where n is a natural number of one or more).

As illustrated in FIG. 7, the table forms a (n×m) matrix. The columns of the matrix correspond to the positions of each of the word lines WL (pages PG0 to PG (n−1)), and the rows of the matrix correspond to the positions of each of the blocks BLK (blocks BLK0 to BLK (m−1)).

For example, as illustrated in FIG. 7, when there is no page for which error correction is necessary in the block BLK0, all columns corresponding to the BLK0 retain a "0" value. On the other hand, as illustrated in FIG. 7, when error correction is necessary in the $(n-2)^{th}$ page PG (n-2) of the block BLK1, then a "1" value is retained in the cell corresponding to the page PG (n-2) of the block BLK1, and "0" is retained in all the other cells corresponding to the pages PG in block BLK 1 for which the error correction is unnecessary. The same is true of the other blocks BLK.

The table is created by, for example, a process of the processor 21. More specifically, the NAND interface circuit transfers the status information received from the semiconductor memory device 10 to the buffer memory 26. Next, the processor 21 extracts the error correction flag from the status information stored in the buffer memory 26. Then, the processor 21 associates the extracted error correction flag with the corresponding word lines WL and blocks BLK in a table, and stores or updates the table in the register 23 accordingly.

By referring to the table, the processor 21 can obtain the information indicating which pages in which blocks require error correction.

After step S22, when the just written data is not the last data to be stored in the cache (No in step S23), the process returns to step S20, and the semiconductor memory device 10 performs the writing process for the remaining data to be stored. On the other hand, when the just written data is the last data (Yes in step S23), the memory system 1 ends the first write operation.

1-2-2-2. Error Check Operation

Figure 8:
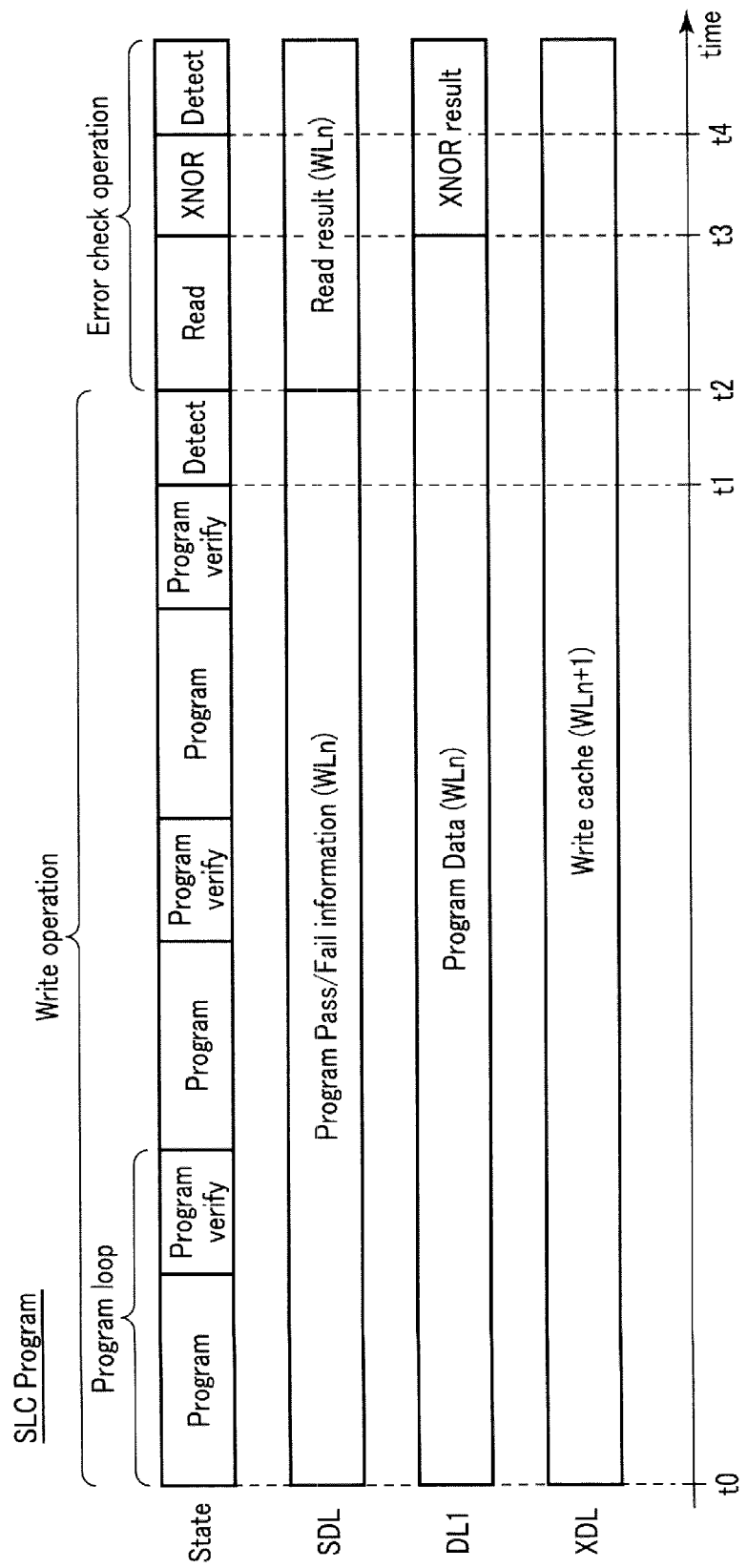
FIG. 8 is a timing chart of the first write operation in the memory system according to the first embodiment.

Next, details of the error check operation will be described in conjunction with FIG. 8. FIG. 8 illustrates a timing chart of the first write operation, and illustrates the process state in each operation and the data retained in the latch circuits SDL, DL1, and XDL.

As illustrated in FIG. 8, the first write operation generally includes a write (program) operation and an error check (program verify) operation. In the following, the write operation included in the first write operation is referred to as a "specific write process", in order to distinguish from an "overall write operation" including the first write operation and the second write operation.

First, at time t0, the specific write process using the SLC scheme is started. This writing includes, for example, three rounds of a program loop and then a detection operation performed after the three rounds of the program loop. The program loop is a combination of a program operation that changes a threshold voltage by injecting electrons into an electric charge storage layer (in a non-writing target cell, suppressing the variation in the threshold voltage by a self-boosting technique or the like, for example) and a program verify operation that determines whether or not the threshold voltage changed by the program operation is at an appropriate level. The detection operation is an operation that checks the verify operation results of the program loops and determines whether or not the number of bits that are failed according to the verify operation (the number of the failed bit) is equal to or greater than a predetermined threshold value.

As illustrated in FIG. 8, while the program loop is being repeated, the latch circuit SDL retains the program verify result, the latch circuit DL1 retains the write data for the selected page, and the latch circuit XDL retains the write data to be written to the next page.

Next, at time t1, the sequencer 17 checks the number of the failed bits by referring to the stored contents of latch circuit SDL in the sense amplifier module. When the number of the failed bits is equal to or greater than the threshold value, the processing returns to time t0, and the program loop rounds are performed again. When the number of the failed bits is less than the threshold value, the processing proceeds to the operation at time t2. The operation for checking the number of the failed bits may be executed after each of the individual program loops or after a prescribed number of rounds of the program loop. In addition, once the check operation has been performed a prescribed number of times or similarly if writing has been attempted for the prescribed number of times, and the number of the failed bits is still not less than the threshold value, the sequencer 17 sets the writing to the target page as a fail status, and information indicating that the writing to the page has failed is retained in the status register 15A.

At time t2, the sequencer 17 starts the error check operation. The error check operation generally includes the three steps of: a read operation, a data calculation operation, and a detection operation. Hereinafter, details of these operations will be described.

As illustrated in FIG. 8, at the time t2, the sequencer 17 starts the read operation. In other words, each of the sense amplifier sections SAU reads the data that was just previously written (the data that was written at a time from t0 to t1) from the memory cell array 11 while still retaining the write data in the latch circuit DL1. The data that is read from the memory cell array 11 is retained in the latch circuit SDL.

Next, at a time t3, the data calculation operation is started. Here, the calculation operation section OP of each of the sense amplifier sections SAU performs an XNOR operation on the data that is retained in the latch circuit SDL and the data that is retained in the latch circuit DL1. That is, the calculation operation section OP determines whether or not the write data (from latch circuit DL1) matches the read data (from latch circuit SDL) for the write target page. This operation result can be retained in the latch circuit DL1. Here, a bit showing a mismatch in the operation result shows that the data is likely to be detected as an error in subsequent readings.

Next, at a time t4, the detection operation is started. In other words, the sequencer 17 checks the number of the sense amplifier sections SAU that indicates a mismatch in the XNOR operation result (the number of the error bits). More specifically, the sequencer 17 sets the error correction flag to "0" when the number of the error bits is less than the threshold value (that is, error correction of the target page is set to unnecessary), and sets the error correction flag to "1" when the number of the error bits exceeds the threshold value (that is, error correction of the target page is set to necessary). The error correction flag can be stored in the status register 15A as described above.

The latch circuits retaining each of the data in the above operation(s) are not limited to the specific one used in the example, and can be variously changed. For example, the XNOR operation result may be retained in a latch circuit DL2 (not specifically illustrated).

1-2-2-3. Command Sequence of First Write Operation

Figure 9:
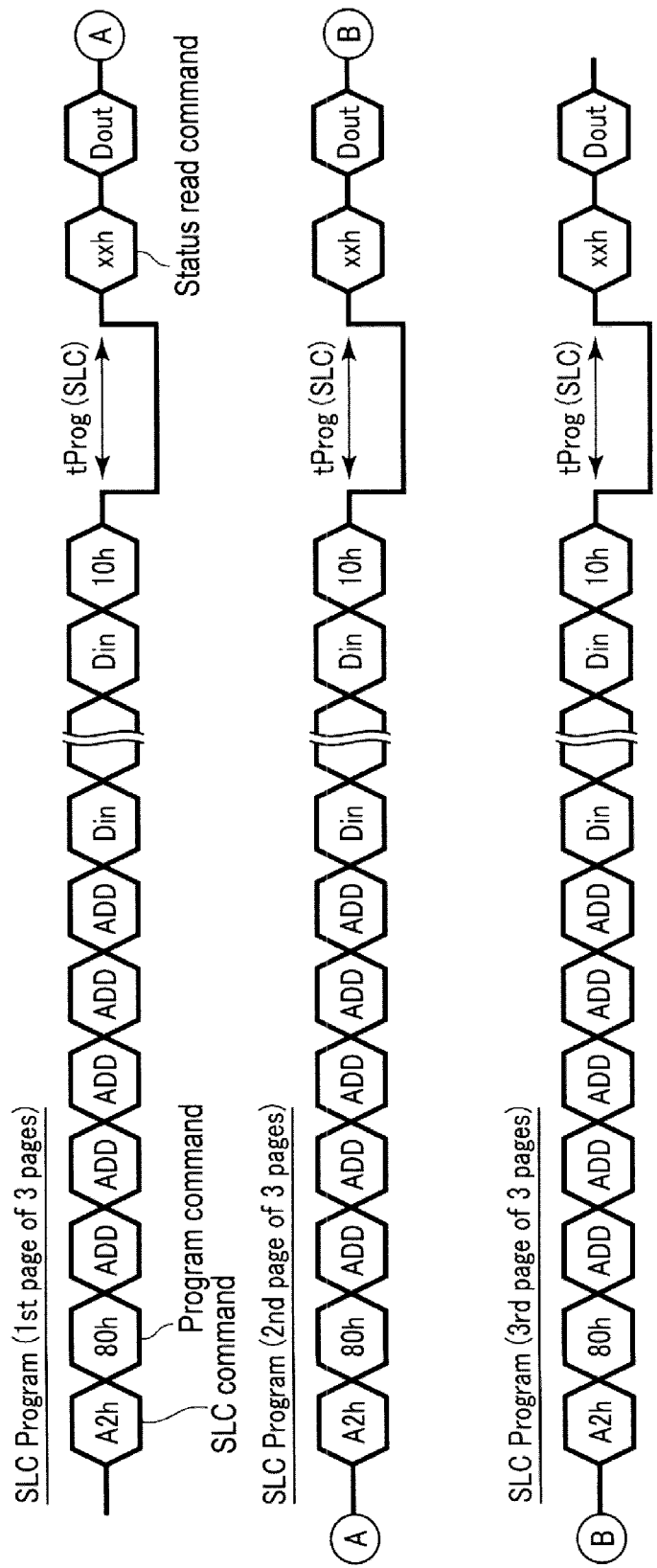
FIG. 9 is a command sequence of the first write operation in the memory system according to the first embodiment.

Next, the command sequence of the first write operation will be described based on FIG. 9. FIG. 9 illustrates an example of the command sequence of the first write operation. Hereinafter, a case where the data of three pages is written in the cache area will be described as an example. In the following description, the address and the command issued from the controller 20 are assumed to be stored in the address register 15B and the command register 15C, respectively.

As illustrated in FIG. 9, the controller 20 first issues a command "A2h" and sends the command to the semiconductor memory device 10. The command "A2h" commands the semiconductor memory device 10 to perform the process using the SLC scheme. Subsequently, the controller 20 issues the write command "80h" and sends this write command to the semiconductor memory device 10.

Next, the controller 20 issues the address information ADD for five cycles, for example, and sends the address information ADD to the semiconductor memory device 10. The address information ADD can be used to assign the address of the cache area. Next, the controller 20 outputs the write data Din to the semiconductor memory device 10 for a plurality of cycles (step S30 in FIG. 5). Here, the data Din that is output corresponds to the data of one page in total, and is retained, for example, in the latch circuit XDL of the sense amplifier module 12.

Next, the controller 20 issues a command "10h" and sends this command to the semiconductor memory device 10. The command "10h" commands the semiconductor memory device 10 to execute the writing of the data based on the address information and the data Din that were just previously sent. When the command "10h" is retained in the register 15C, the sequencer 17 starts the write operation using the SLC scheme (that includes an error check operation) by controlling the sense amplifier module 12, the row decoder 13, and the like (step S20 in FIG. 5). At this time, the sense amplifier module 12 decodes the column address signal CA of the address information in the register and sends the data Din retained in the latch circuit XDL to each of the bit lines BL. The row decoder 13 decodes the row address signal RA of the address information in the register, and applies desired voltages to the selected word lines and the non-selected word lines. At this time, the ready/busy control circuit 18 notifies the controller 20 that the semiconductor memory device 10 is in a busy state, by setting the ready/busy signal to a "L" level. When the semiconductor memory device 10 ends the write operation, the ready/busy control circuit 18 notifies the controller 20 that the semiconductor memory device 10 is in a ready state by setting the ready/busy signal to a "H" level. The tProg(SLC) illustrated in FIG. 9 corresponds to a period of time during which the write operation using the SLC scheme is performed.

Next, the controller 20 issues a command "xxh" and sends this command to the semiconductor memory device 10 (step S31 in FIG. 5). The command "xxh" is a command for the reading the status information from the status register 15A. When the command "xxh" is retained in the register 15C, the sequencer 17 reads the status information including the error correction flag stored in the register 15A (step S21 in FIG. 5) and outputs the data Dout including the status information to the controller 20 (step S22 in FIG. 5). When the data Dout is received, the controller 20 extracts the error correction flag from the data Dout and stores the extracted error correction flag in the register 23 (step S32 in FIG. 5).

The operation described above corresponds to the writing of the data of a first page to the cache area. The subsequent writings of the data of a second page and the data of a third page have the same command sequence as that of the data of first page, excepting only that the contents of the address information ADD and the data Din and Dout are different, and thus, the description thereof will be omitted.

1-2-3. Second Write Operation 1-2-3-1. Details of Second Write Operation

Figure 10:
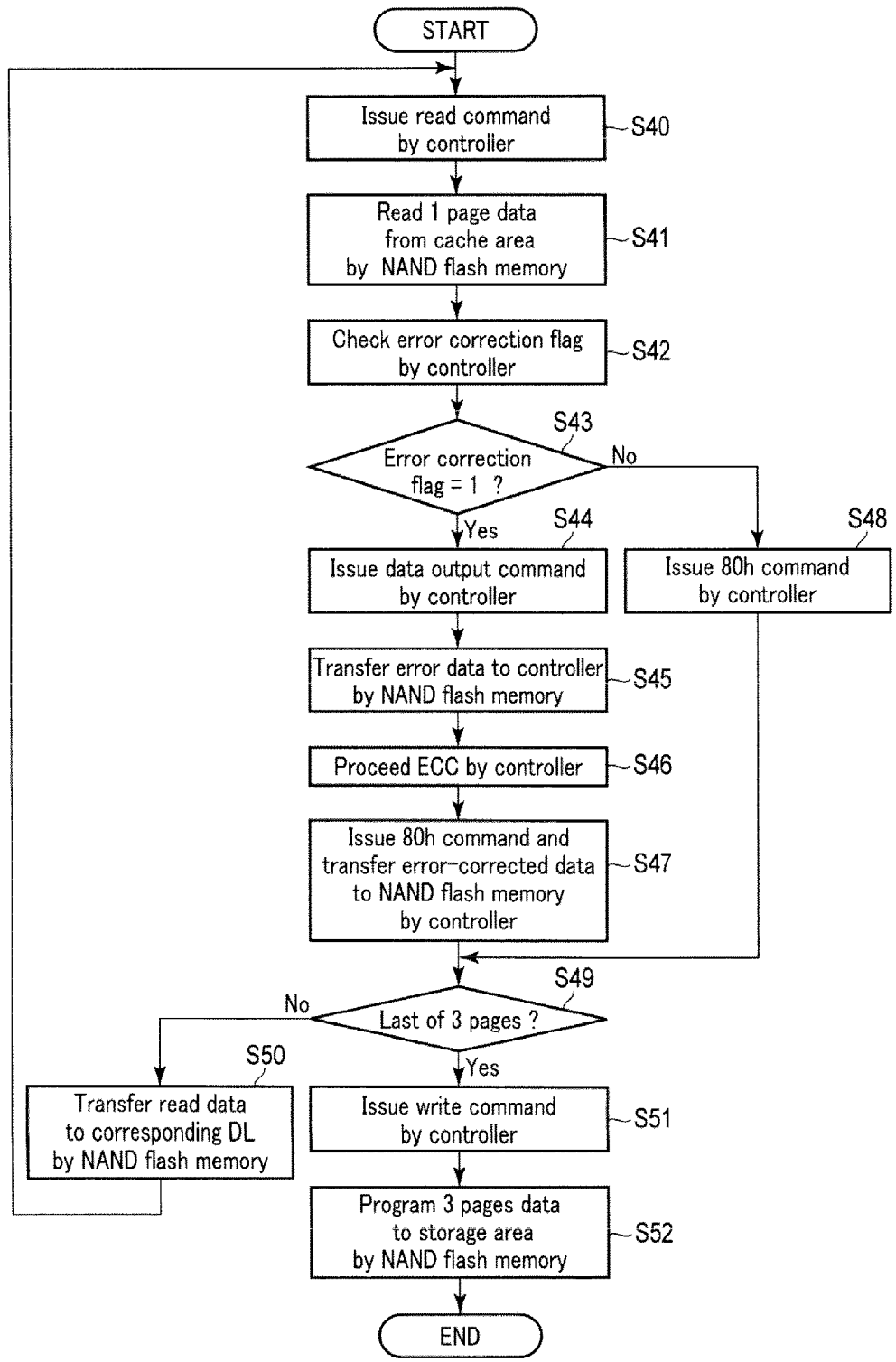
FIG. 10 is a flowchart of a second write operation in the memory system according to the first embodiment.

Next, details of the second write operation will be described based on FIG. 10. FIG. 10 illustrates a flowchart of the second write operation.

As illustrated in FIG. 10, first, the controller 20 issues a read command and sends the read command to the semiconductor memory device 10 (step S40). The read command is a command that commands the semiconductor memory device 10 to read the data of one page to the sense amplifier module from the memory cell array 11. Subsequently, the controller 20 sends the address of the area to be read. The address corresponds to one of the pages of the cache area of the memory cell array 11.

The sequencer 17 reads the data of one page from the cache area of the memory cell array 11 based on the received read command (step S41). More specifically, the row decoder 13 decodes the row address signal RA of the address information in the register 15 and applies desired voltages to the selected word lines and the non-selected word lines. The sense amplifier module 12 senses the data that is read to the bit line. At this time, the read data is retained, for example, in the latch circuit SDL of each of the sense amplifier sections SAU.

Next, the processor 21 of the controller 20 checks the error correction flag corresponding to the page from which the data was just previously read, by referring to the table stored in the register 23 (Step S42).

Here, when the error correction flag is "1" (Yes in step S43), that is, when the target data is data for which the error correction is necessary, the controller 20 issues a data output command and sends this data output command to the semiconductor memory device 10 (step S44). The data output command commands the output of the data to the controller 20 from the sense amplifier module 12. Subsequently, the controller 20 sends the address of the sense amplifier unit to be read.

Based on the just received data output command, the sequencer 17 transfers data to the controller 20 from the latch circuit SDL of the sense amplifier section SAU corresponding to the address via the latch circuit XDL (step S45). The data is retained, for example, in the buffer memory 26.

Next, the ECC circuit 24 of the controller 20 executes the error correction process on the received read data (step S46).

Next, the controller 20 issues a command "80h" and sends this command to the semiconductor memory device 10. Subsequently, the controller 20 transfers the error-corrected read data to the semiconductor memory device 10 as write data (step S47).

On the other hand, in step S43, when the error correction flag is "0" (No in step S43), that is, when it is unnecessary perform error correction on the target data, the controller 20 issues a command "80h" and sends this command to the semiconductor memory device 10 (step S48). In this case, error-corrected write data is not sent from the controller 20 to the semiconductor memory device 10.

After either of step S47 or step S48, the controller 20 determines whether or not the data that was read from the cache area is the last data of three pages to be written using the TLC scheme to the memory cells connected to the same word line in the storage area (step S49).

When the data that is read from the cache area is not the last data of the three pages (No in step S49), the controller 20 commands the semiconductor memory device 10 to transfer the read data to the latch circuit DL1 or DL2 (whichever is presently available) (step S50), and the process returns to the operation of step S40.

On the other hand, when the data that is read from the cache area is the last data of three pages (Yes in step S49), the controller 20 issues the write command and sends this command to the semiconductor memory device 10 (step S51). The write command commands the semiconductor memory device 10 to actually start the writing of the data to the memory cells of the storage area.

Then, in step S52, the sequencer 17 writes the three-bit data that is retained in each of the latch circuits SDL, DL1, and DL2 for each of the sense amplifier sections SAU to the memory cells connected to the same word line WL in the storage area using the TLC scheme, in accordance with the write command received in step S51. More specifically, the row decoder 13 decodes the row address signal RA of the address information in the register 15 and applies desired voltages to selected word lines and non-selected word lines. The sense amplifier module 12 transfers the data retained in the latch circuits SDL, DL1, and DL2 to each of the bit lines BL. More specifically, the voltages corresponding to these retained data are applied to the appropriate bit lines BL. In this manner, when the writing of the three-bit data ends, the memory system 1 ends the second write operation.

In the description described above, the operations from step S40 to step S50 correspond to the operation of step S11 illustrated in FIG. 4, and the operations of step S51 and step S52 correspond to the operation of step S12 illustrated in FIG. 4.

Before the writing of the data to the storage area is performed, the number of pages of the data that is retained in each of the sense amplifier sections SAU changes based on the writing scheme being applied to the storage area. In other words, the number of the latch circuits that is necessary to be included in each of the sense amplifier sections SAU also changes based on the number of the bits of the data that is to be stored in the memory cells of the storage area.

1-2-3-2. Command Sequence of Second Write Operation

Figure 11:
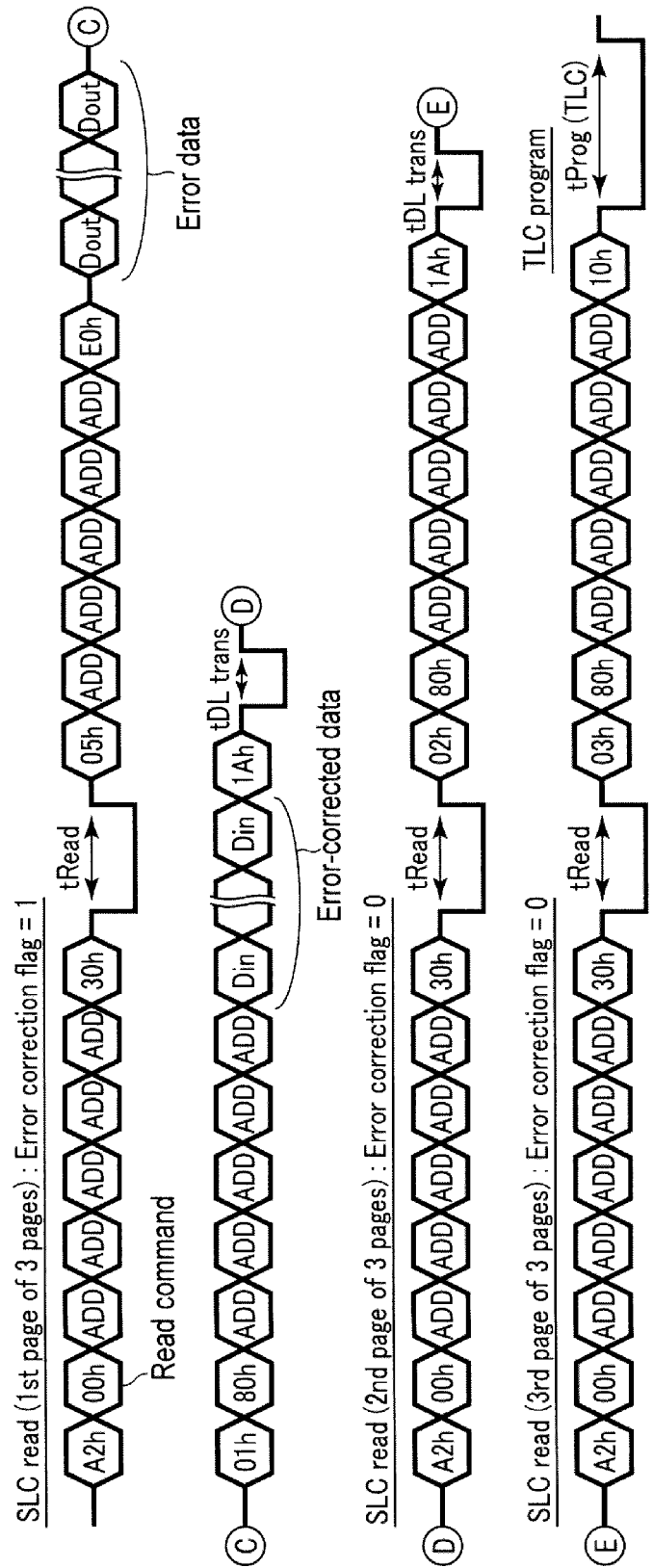
FIG. 11 is a command sequence of the second write operation in the memory system according to the first embodiment.
Figure 12:
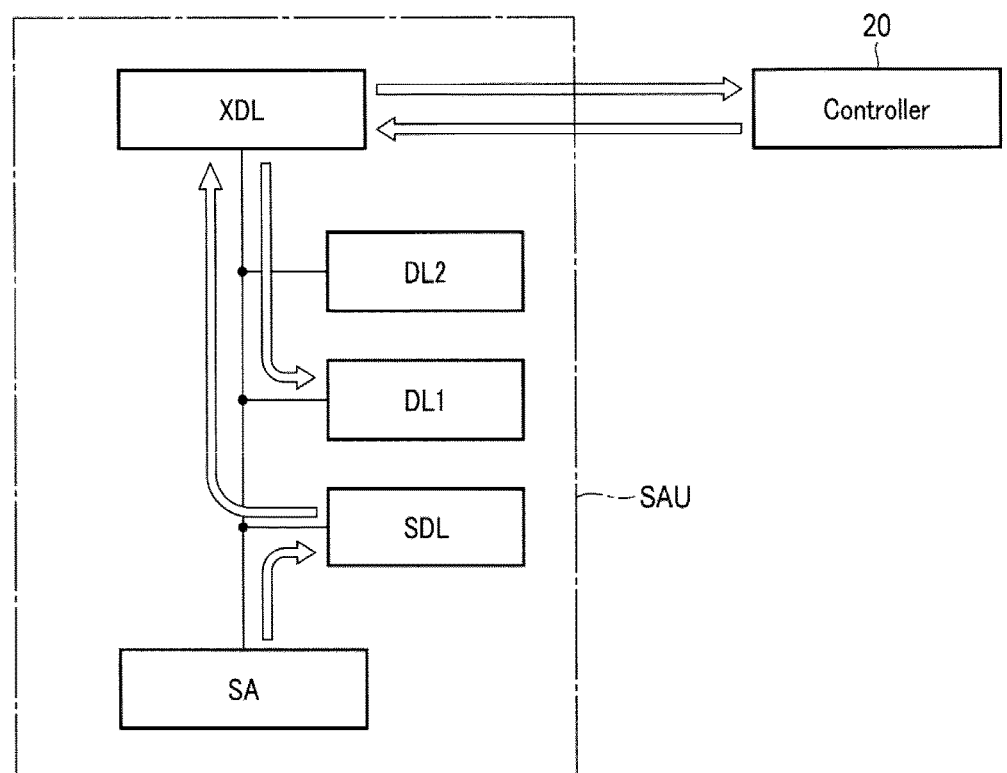
FIG. 12 is a diagram depicting aspects of the second write operation in the memory system according to the first embodiment.
Figure 13:
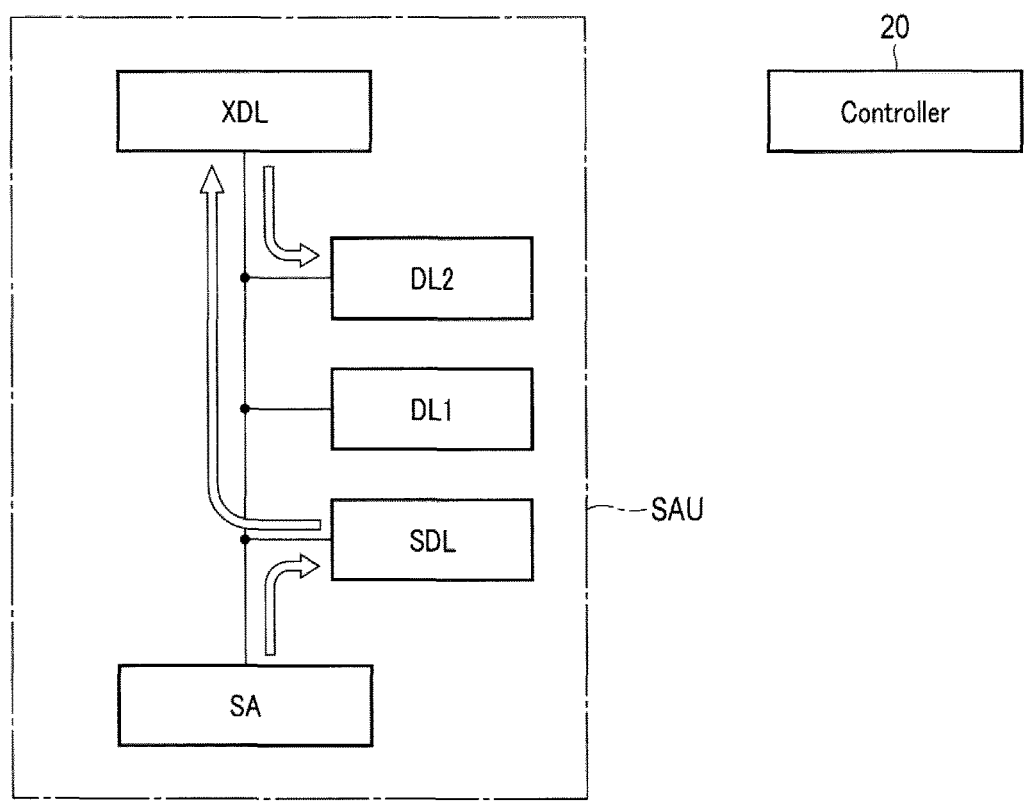
FIG. 13 is a diagram depicting aspects of the second write operation in the memory system according to the first embodiment.

Next, the command sequence of the second write operation will be described based on FIGS. 11 to 13. FIG. 11 illustrates an example of the command sequence of the second write operation. FIGS. 12 and 13 respectively illustrate examples of the transfer path of the data when the error correction flag is "1" and when the error correction flag is "0". For purposes of explanation, an error correction flag in first page is considered to be "1," and the error correction flags in second page and third page are considered to be "0" for the data of the three pages to be read from the cache area. Though, of course, these particular values are non-limiting examples.

As illustrated in FIG. 11, the controller 20 sequentially issues commands "A2h" and "00h" and sends these commands to the semiconductor memory device 10 (step S40 in FIG. 10). The command "00h" corresponds to the address input reception command for the reading being instructed in step S40 and commands the semiconductor memory device 10 to read data. Next, after issuing the "00h" command, the controller 20 issues the address information ADD for five cycles, for example, and sends this address information to the semiconductor memory device 10. The address information ADD is used to assign the address of the cache area. Next, the controller 20 issues a command "30h" and sends this command to the semiconductor memory device 10. The command "30h" commands the semiconductor memory device 10 to execute the reading of the data based on the address information that was just previously sent. Once the command "30h" is stored in the register 15C, the sequencer 17 starts the read operation by controlling the sense amplifier module 12, the row decoder 13, and the like (step S41 in FIG. 10). At this time, the ready/busy control circuit 18 notifies the controller 20 that the semiconductor memory device 10 is in a busy state, by setting the ready/busy signal to the "L" level. When the semiconductor memory device 10 ends the read operation, the ready/busy control circuit 18 notifies the controller 20 that the semiconductor memory device 10 is in a ready state by setting the ready/busy signal to the "H" level. The tRead period illustrated in FIG. 11 indicates a period of time during which the read operation is performed.

When the error correction flag is "1" (Yes in step S43 of FIG. 10), the controller 20 issues a command "05h" after the read operation ends, and sends this command to the semiconductor memory device 10 (step S44 in FIG. 10). The command "05h" is a command that corresponds to the data output command described in step S44 and commands the output of data to the controller 20 from the semiconductor memory device 10. The controller 20 issues and sends the address information ADD for five cycles, for example, and then issues and sends a command "E0h." Here, the address information ADD corresponds to the address of the data that was just previously subjected to read. The command "E0h" is a command that commands the semiconductor memory device 10 to execute the output of data to the controller 20 based on the address information that was just sent. When the command "E0h" is stored in the register 15C, the read data Dout including an error (or errors) that is retained in the sense amplifier module 12 is output to the controller 20 (step S45 in FIG. 10). Then, the controller 20 corrects the error(s) in the read data Dout using the ECC circuit 24 (step S46 in FIG. 10).

Next, the controller 20 sequentially issues commands "01h" and "80h", and sends these commands to the semiconductor memory device 10 (step S47 in FIG. 10). The command "01h" is a command that indicates the writing of data to first page and commands the data transfer to the corresponding latch circuit. The controller 20 issues the address information ADD for five cycles, for example, and sends the address information ADD to the semiconductor memory device 10. The address information ADD is used to assign the address of the storage area. After the address information ADD, the controller 20 outputs the error-corrected read data Din to the semiconductor memory device 10, and then issues and sends a command "1Ah." When the command "1Ah" is stored in the register 15C, the sequencer 17 transfers the input read data Din to the latch circuit DL1 of the corresponding sense amplifier section SAU (step S50 in FIG. 10). At this time, the ready/busy control circuit 18 notifies the controller 20 that the semiconductor memory device 10 is in a busy state by setting the ready/busy signal to the "L" level. When the data transfer ends, the ready/busy control circuit 18 notifies the controller 20 that the semiconductor memory device 10 is in a ready state by setting the ready/busy signal to the "H" level. The period tDLtrans illustrated in FIG. 11 indicates a period of time during which the data transfer is performed.

The description above corresponds to the reading of the data of the first page when the error correction flag is "1." FIG. 12 illustrates the transfer path of the read data in this operation.

In the reading of the data of second and subsequent pages, the command sequence when the respective error correction flag is "0" is different from the command sequence when the error correction flag is "1" in that the command associated with the error correction process is not issued. Hereinafter, the reading and the writing of the data of second and subsequent pages will be described, focusing on a difference from the case where the error correction flag is "1."

As illustrated in FIG. 11, in the reading of the data of second page, the controller 20 issues a command "A2h" and operates in the same manner as the case where the error correction flag is "1" up until the reading of the data ends (until the period tRead ends).

Then, the controller 20 issues commands "02h" and "80h" and sends these commands to the semiconductor memory device 10 (step S48 in FIG. 10). The command "02h" is a command that indicates the writing of data of the second page and commands data transfer to the corresponding latch circuit. The controller 20 next issues the address information ADD for five cycles, for example, and sends the address information ADD to the semiconductor memory device 10. Then, the controller 20 issues a command "1Ah" and sends this command to the semiconductor memory device 10. When the command "1Ah" is received, the semiconductor memory device 10 transfers the read data to the latch circuit DL2.

For the reading of the data of second page, FIG. 13 illustrates the transfer path of the read data when the error correction flag is "0." As illustrated in FIG. 13, the operation does not include the data transfer between the sense amplifier section SAU and the controller 20 when the error correction flag is "0."

As illustrated in FIG. 11, for the reading of the data of the third page, the commands "03h" and "10h" are issued in the same manner as the commands "02h" and "1Ah" were issued in the reading of the data of the second page. The command "03h" is a command that indicates the writing of data of the third page, and the command "10h" is a command that commands writing using the TLC scheme.

When the command "10h" is stored in the register 15C, the sequencer 17 performs the write operation using the TLC scheme by controlling the sense amplifier module 12, the row decoder 13, and the like (step S52 in FIG. 10). At this time, the ready/busy control circuit 18 notifies the controller 20 that the semiconductor memory device 10 is in a busy state by setting the ready/busy signal to the "L" level. When the semiconductor memory device 10 ends the write operation, the ready/busy control circuit 18 notifies the controller 20 that the semiconductor memory device 10 is in a ready state by setting the ready/busy signal to the "H" level. The period tProg (TLC) illustrated in FIG. 11 indicates a period of time during which the write operation using the TLC scheme is performed.

According to the operation described above, the data of three pages that is read from the cache area is written to the memory cells connected to the same word line WL in the storage area.

1-3. Effects According to First Embodiment

Next, effects according to the first embodiment will be described. According to the semiconductor memory device 10 of the first embodiment, it is possible to perform the write operation at a high speed while maintaining the reliability of the data.

In a semiconductor memory device having a cache area comprised of memory cells that store one-bit data and a storage area comprised of memory cells that stores two-bit (or more) data, the write data is first written to the cache area and then later written to the storage area. Thus, it is possible to accelerate the write speed as compared to a case where the data would be directly written to the storage area.

However, due to the influence of miniaturization or the like, when the number of the erroneous bits in the data read from the cache area increases, an error correction process becomes necessary. When the error correction process is performed, data is required to be exchanged between the semiconductor memory device and the controller, and this takes more time. Thus, the effective writing speed becomes slow.

Therefore, the semiconductor memory device 10 according to the first embodiment performs the error check operation when the writing to the cache area is performed, and determines whether or not another error correction process will be necessary when the writing again to the storage area based on a check result.

More specifically, in the error check operation, the semiconductor memory device 10 checks whether or not the data just written to cache area reads correctly immediately after the writing of data to the cache area. Then, the semiconductor memory device 10 sets the error correction flag when the number of detected error bits in the just written data of the cache area is equal to or greater than a predetermined value, and sends this error flag information to the controller 20. The controller 20 creates a table based on the received error flag information, and stores the table in the register 23. Accordingly, the controller 20 can recognize the address of the pages in the cache area of the memory cell array 11 for which the error correction is necessary.

The controller 20 then performs error correction based on the error correction flag. More specifically, the controller 20 reads the data from the semiconductor memory device 10 and corrects the errors in the just written data using the ECC circuit 24 when the page for which the error correction flag is "1" is to be written again. Then, this corrected data is sent to the semiconductor memory device 10, and the semiconductor memory device 10 writes this data to the memory cell array 11. On the other hand, when the page for which the error correction flag is "0" is to be written again, the controller 20 does not read the data in particular, and the semiconductor memory device 10 writes data that was read to the sense amplifier module 12 to the memory cell array 11 without error correction.

Accordingly, the semiconductor memory device 10 according to the first embodiment performs error correction for the writing of data to the storage area when the number of error bits of the data that was read from the cache area is large. Thus, it is possible to improve the reliability of the data. In addition, when the data is being written to the storage area, the error correction process is performed only if determined necessary, and thus it is possible to perform the overall write operation at a higher speed.

2. Second Embodiment

Next, a memory system 1 according to a second embodiment will be described. In the second embodiment, the error correction flag of the first embodiment is changed to a shift read flag. Therefore, when the data is read from the cache area in the second write operation, a shift read based on the shift read flag status is performed. Hereinafter, differences in the second embodiment from the first embodiment will be described.

2-1. Shift Read

Figure 14:
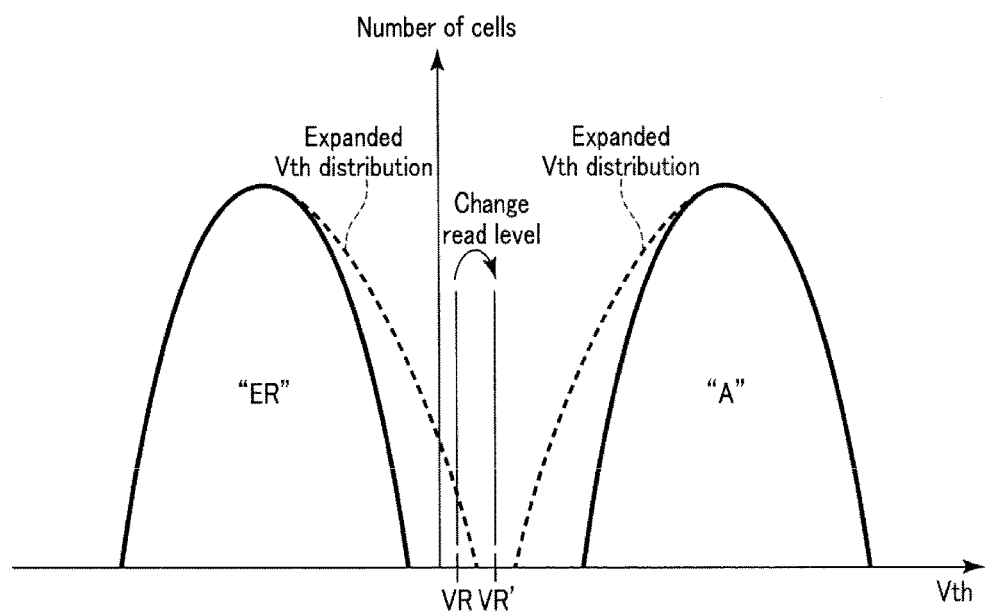
FIG. 14 is a diagram depicting aspects of a threshold value distribution of memory cell transistors included in the semiconductor memory device that is provided in the memory system according to a second embodiment.

A shift read will be described in conjunction with FIG. 14. FIG. 14 illustrates a threshold voltage distribution of memory cells that stores one-bit data. In FIG. 14, the vertical axis corresponds to the number of the memory cells and the horizontal axis corresponds to the value of the threshold voltage Vth of the memory cell(s).

As illustrated in FIG. 14, a memory cell that stores one-bit data acquires one of two nominal threshold voltage values. The low-side threshold value (distribution "ER") illustrated in FIG. 14 corresponds to an erase (erased) state, and data "1" is allocated thereto, for example. On the other hand, the high-side threshold value (distribution "A") is in a write (written) state, and data "0" is allocated thereto, for example. When the data stored in the memory cell is read, the read voltage VR is set between the threshold voltage distribution "ER" and the threshold voltage distribution "A", and thus the data value stored in the memory cell (s) can be determined.

However, when the memory cells deteriorate or when memory cells have a defect, as illustrated by the broken line of FIG. 14, the threshold voltage distribution may expand. For example, as illustrated in FIG. 14, when the high side of the expanded threshold voltage distribution "ER" exceeds the read voltage VR, the number of error bits in the read data increases when the read voltage VR is used.

Therefore, a shift read that changes the voltage used for the reading of the data is performed on the page for which the number of the error bits has found to have increased or become high. More specifically, as illustrated in FIG. 14, the voltage used for the reading of the data in the shift read is changed to the read voltage VR', which is obtained by shifting the read voltage VR to a higher level, for example. The shift amount of the read voltage VR can be optimized to according to the expanded threshold voltage distribution (s).

A shift read using the optimized read voltage VR' can reduce the number of the error bits in the read data even when reading data in memory cells that are deteriorated or defective.

In the memory system 1 of the second embodiment, a shift read is performed based on the shift read flag status. The shift read flag status is set based on the result of an error check operation described for the first embodiment. For example, in the error check operation, the shift read flag is set to "0" when the number of the error bits is less than a threshold value, and the shift read flag is set to "1" when the number of the error bits exceeds the threshold value. In this case, the shift read flag "0" indicates that a shift read of the targeted page is unnecessary, and the shift read flag "1" indicates that a shift read of the targeted page is necessary.

The shift amount and shift direction of the read voltage VR' from the read voltage VR can be changed. For example, when the low end of the expanded threshold value distribution "A" is lower than the read voltage VR, the read voltage VR can be shifted lower.

2-2. Write Operation

Next, a write operation of the memory system 1 according to the second embodiment will be described. The outline of the write operation is the same as the first embodiment, and details of the first and second write operations are only partially different from the first embodiment. Hereinafter, the first and second write operations of the memory system 1 according to the second embodiment will be described focusing on the differences from the first embodiment.

2-2-1. Details of First Write Operation

Figure 15:
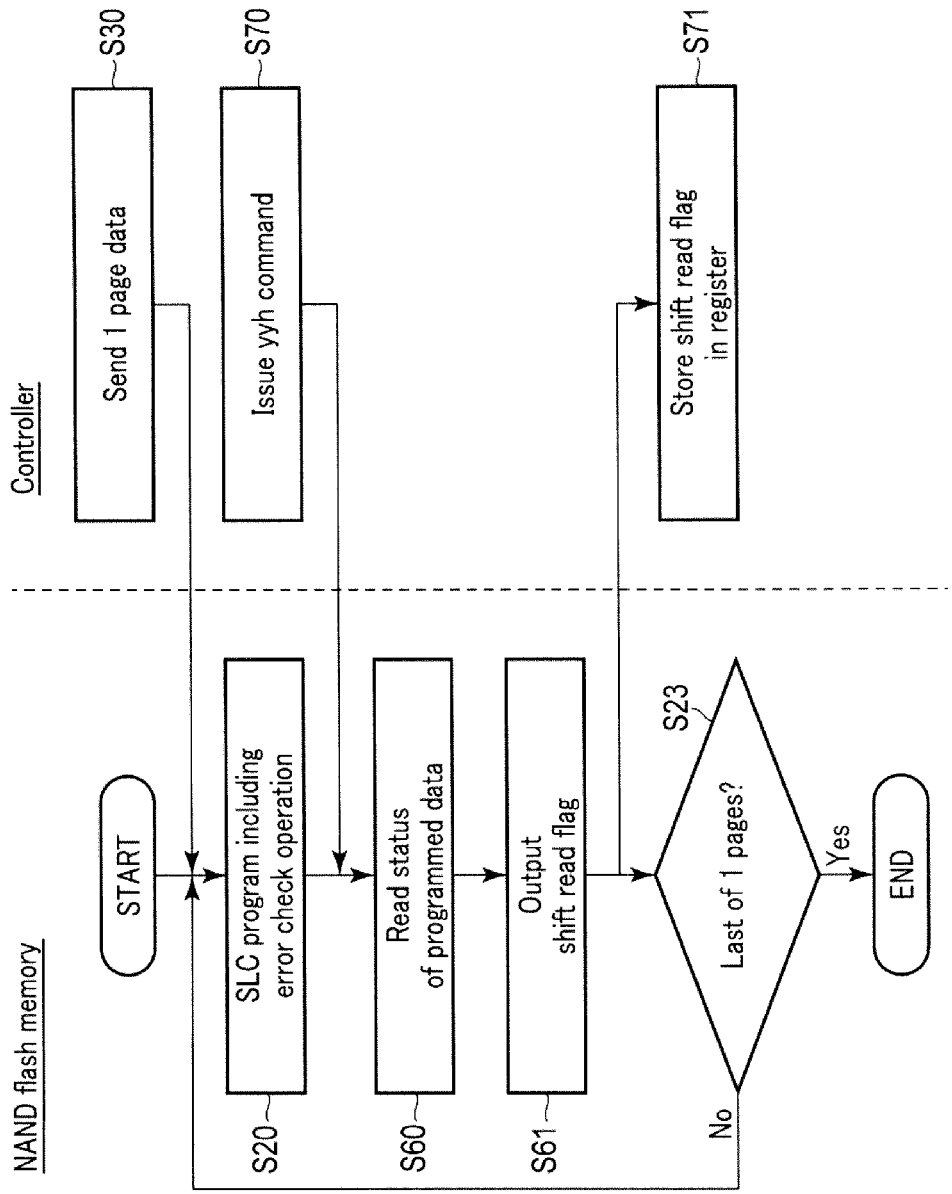
FIG. 15 is a flowchart of the first write operation in the memory system according to the second embodiment.

A first write operation in the second embodiment will be described in conjunction with FIGS. 15 and 16. FIG. 15 illustrates a flowchart of a write operation to the cache area, and FIG. 16 illustrates a status read result when performing the write operation to the cache area. In a first write operation of the memory system 1 according to the second embodiment, the operation associated with the error correction flag in FIG. 5 described in the first embodiment is replaced with the operation associated with the shift read flag.

As illustrated in FIG. 15, first, the semiconductor memory device 10 and the controller 20 respectively perform the operations of step S20 and step S30. However, in the error check operation in step S20 of this second embodiment, a shift read flag, based on the error check result, is stored in the status register 15A.

Next, the semiconductor memory device 10 receives a status read command "yyh" issued by the controller 20 (step S70), and stores the received command "yyh" in the command register 15C. The command "yyh" commands the reading of status information including the shift read flag. When the command "yyh" is stored in the command register 15C, the sequencer 17 reads the status information including the shift read flag from the status register 15A (step S60).

The status information that is read is then output to the controller 20 via the signal lines DQ0 to DQ7 (step S61), and the controller 20 stores the shift read flag included in the received status information in the register 23 as a table (step S71). The subsequent operations are substantially the same as those of FIG. 5 described in conjunction with the first embodiment, and thus the description thereof is omitted.

In step S61, the status information that is output from the semiconductor memory device 10 is, for example, information as illustrated in FIG. 16. As illustrated in FIG. 16, the status information including the shift read flag is substantially the same as the status information that would be obtained by replacing the error correction flag included in the status information described in conjunction with FIG. 6 with the shift read flag.

The configuration and method of creating the table of the shift read flags to be stored in the register 23 are substantially the same as those for the table of the error correction flag described in FIG. 7, for example.

2-2-2. Second Write Operation 2-2-2-1. Details of Second Write Operation

Figure 17:
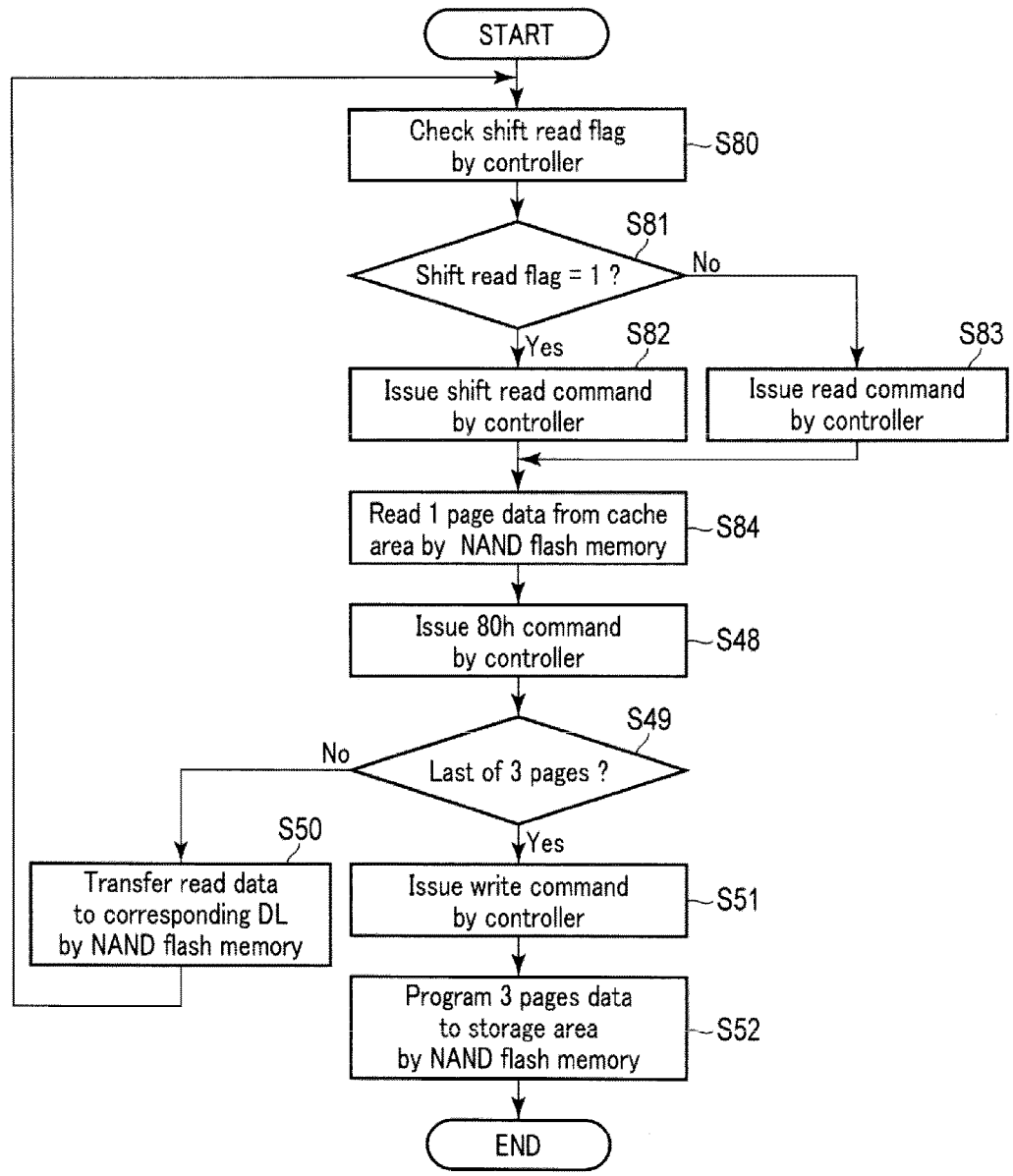
FIG. 17 is a flowchart of the second write operation in the memory system according to the second embodiment.

Next, the second write operation will be described in conjunction with FIG. 17. FIG. 17 illustrates a flowchart of the second write operation. In the second write operation of the memory system 1 according to the second embodiment, the operation associated with the error correction flag in FIG. 10 that was described in the first embodiment is replaced with an operation associated with the shift read flag.

As illustrated in FIG. 17, the processor 21 of the controller 20 first checks the shift read flag corresponding to the page to be read by referring to the table stored in the register 23 (step S80).

Here, when the shift read flag is "1" (Yes in step S81), that is, when the shift read is necessary for the target page, the controller 20 issues and sends a shift read command to the semiconductor memory device 10 (step S82). The shift read command commands the semiconductor memory device 10 to read the data of one page to the sense amplifier module 12 from the memory cell array 11 using the shift read (a read operation with a shifted read voltage level).

On the other hand, in step S81, when the referred shift read flag is "0" (No in step S81), that is, when the shift read is unnecessary for the target page, the controller 20 issues and sends a normal read command to the semiconductor memory device 10 (step S83).

After either of step S82 or step S83, the controller 20 sends the address of the target area to be read. The address corresponds to one of the pages in the cache area of the memory cell array 11.

The sequencer 17 reads data of one page from the cache area of the memory cell array 11 based on the received shift read command or the read command (step S84). That is, in step S84, when the process is subjected to step S82, a shift read is performed, and when the process is subjected to step S83, a normal read is performed. In the shift read and the normal read, the voltage applied to the word line WL is different during the read operation.

After step S84, the process proceeds to step S48 described above. The subsequent operations are the same as those of FIG. 10 described for the first embodiment, excepting that the process proceeds from step S50 to step S80 in FIG. 17.

2-2-2-2. Command Sequence of Second Write Operation

Figure 18:
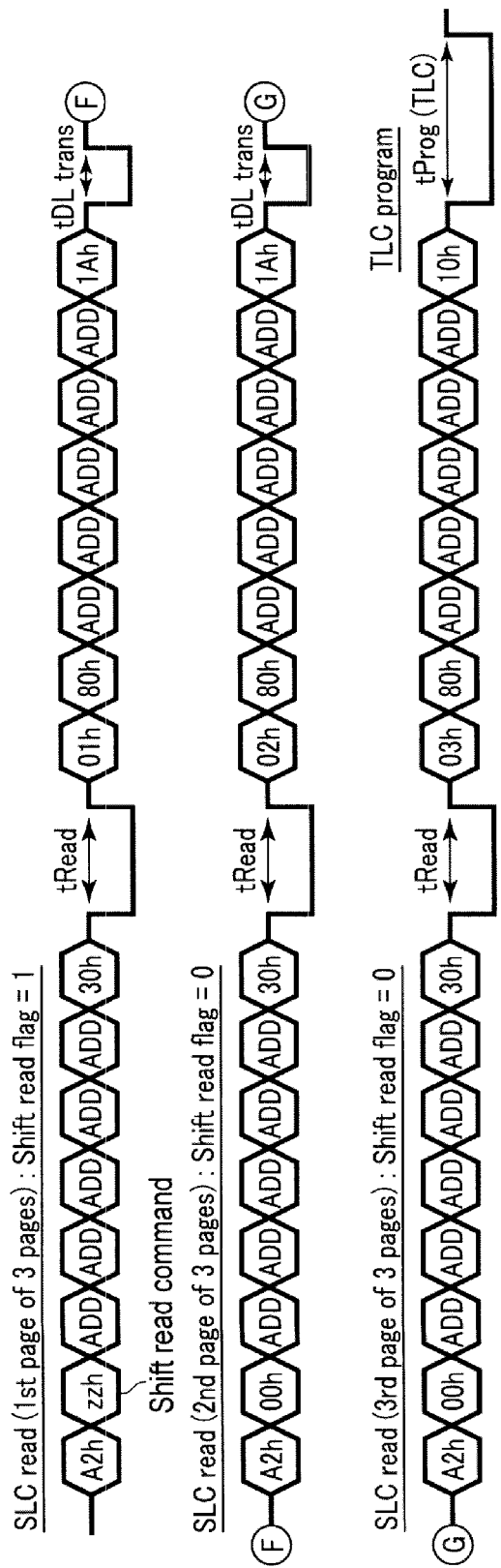
FIG. 18 is a command sequence of the second write operation in the memory system according to the second embodiment.

Next, the command sequence of the second write operation in the second embodiment will be described in conjunction with FIG. 18. FIG. 18 illustrates an example of the command sequence of the second write operation in the second embodiment. For purposes of explanation, a shift read flag of first page is considered to be "1," and the shift read flags of second page and third page are considered to "0" for the data of three pages to be read from the cache area. Though, of course, these particular values are non-limiting examples.

As illustrated in FIG. 18, the controller 20 sequentially issues a command "A2h" and a shift read command "zzh" and sends these commands to the semiconductor memory device 10 (step S82 in FIG. 17). The command "zzh" corresponds to the shift read command described in step S82.

Next, the controller 20 issues the address information ADD for five cycles, for example, and sends the address information ADD to the semiconductor memory device 10. The address information ADD is used to assign the address of the cache area. Next, the controller 20 issues a command "30h" and sends this command to the semiconductor memory device 10. When the command "30h" is stored in the register 15C, the sequencer 17 starts a shift read by controlling the sense amplifier module 12, the row decoder 13, and the like. When the shift read is performed, the data is read to the sense amplifier SA of each of the sense amplifier sections SAU, and the data that is read is transferred to the latch circuit SDL from the sense amplifier SA.

Next, the controller 20 issues commands "01h" and "80h" in sequence and sends these commands to the semiconductor memory device 10. Then, the controller 20 issues the address information ADD for five cycles, for example, and sends the address information ADD to the semiconductor memory device 10. Subsequently, the controller 20 issues a command "1Ah" and sends this command to the semiconductor memory device 10. When the command "1Ah" is received, the semiconductor memory device 10 transfers the read data to the latch circuit DL1 (step S50 in FIG. 17).

The subsequent operations are the same as those of FIG. 11 described for the first embodiment, and thus the description thereof is omitted. That is, the command sequence when the shift read flag is "0" is otherwise same as the command sequence when the error correction flag is "0" of FIG. 11 described for the first embodiment.

2-3. Effects of Second Embodiment

Next, the effects of the second embodiment will be described. According to the semiconductor memory device 10 of the second embodiment, it is possible to increase the writing speed as compared to the first embodiment.

In a semiconductor memory device according to the second embodiment, the number of the error bits occurring in the reading of the data from the cache area can be reduced in some cases by performing a shift read.

Therefore, the semiconductor memory device 10 according to the second embodiment creates a table based on the shift read flag which is set in an error checking operation on data written to the cache area. The shift read flag status for particular pages is set by a comparison of the number of the error bits to a predetermined value. The table information indicates the page (s) in the memory cell array 11 for which the shift read is deemed necessary. The table is sent to the controller 20, and thus the controller 20 can recognize the address of the pages for which the shift read is necessary.

Furthermore, the controller 20 issues the shift read command based on the shift read flag. More specifically, when the page for which the shift read flag is "1" is being written again, a shift read command is issued, and the semiconductor memory device 10 reads the data from the cache area by the shift read. On the other hand, when the page for which the shift read flag is "0" is being written again, a normal read command is issued, and the semiconductor memory device 10 reads the data from the cache area by the normal read operation. Then, the data read in these manners is then written to the storage area.

Accordingly, the semiconductor memory device 10 according to the second embodiment can improve the reliability of the stored data, similar to the first embodiment. In addition, in the shift read, as in the case of performing the error correction process, the data is not exchanged between the semiconductor memory device 10 and the controller 20, and thus it is possible to perform the write operation at a high speed.

3. Modification Examples

A semiconductor memory device (e.g., semiconductor memory device 10 in FIG. 1) according to an embodiment includes a first memory cell (e.g., cache area in FIG. 2) that can store n-bit data (where n is a natural number of one or more), a second memory cell (e.g., storage area in FIG. 2) that can store m-bit data (where m is a natural number of two or more and m>n), and a sense amplifier module (e.g., sense amplifier module 12 in FIG. 2) that performs reading and writing of the data from/to the first and second memory cells. When the semiconductor memory device receives a first command (e.g., "80h" in FIG. 9) from an external controller (e.g., controller 20 in FIG. 1), the sense amplifier module writes first data to the first memory cell (e.g., "Program" in FIG. 8). Then, the sense amplifier module reads the first data from the first memory cell after the writing (e.g., "Read" in FIG. 8), and compares the first data to the first data that was just read (e.g., "XNOR" in FIG. 8). When the semiconductor memory device receives a second command that is different from the first command after receiving the first command (e.g., "80h" in FIG. 11), the sense amplifier writes the first data that was read from the first memory cell to the second memory cell, or writes second data received from the controller to the second memory cell, based on the comparison result.

In addition, a memory system according to an embodiment includes a semiconductor memory device and a controller, which can output the first command and the second command.

Accordingly, it is possible to provide a semiconductor memory device and a memory system that can perform data operations at a high speed.

The present disclosure is not limited to the first and second embodiments, and can be variously modified. For example, a semiconductor memory device 10 including one plane in which the memory cell array 11, and the sense amplifier module 12 and the row decoder 13 corresponding to the memory cell array are disposed is described as an example, but the present disclosure is not limited thereto. That is, a semiconductor memory device 10 may include two or more planes controlled by the single sequencer 17. In this case, the error correction flag and the shift read flag are respectively set for each of the planes, and each of these flags can be included in the status information for each of the planes when output via different signal lines DQ by the status read command.

In addition, the first and second embodiments can be simultaneously applied by setting the threshold value of the number of error bits used to establish the flag status in the error check operation to a different value for the error correction flag and the shift read flag. For example, for the threshold value, the threshold value for setting the error correction flag status is higher than that used for setting the shift read flag status. In this case, when the number of the error bits detected by the error check operation is small, and improvement by the shift read is expected, the shift read process can be applied, and when the number of the error bits detected by the error check operation is large, and error correction seems necessary, the error correction process can be applied. Accordingly, it is possible to improve the writing speed while maintaining the reliability of the data. The semiconductor memory device 10 may simultaneously output the error correction flag and the shift read flag to the controller 20 in response to a single status read command.

In addition, although the controller 20 respectively issues the status read command "xxh" in step S31 illustrated in FIG. 5 and the status read command "yyh" in step S70 illustrated in FIG. 15, the controller 20 may instead issue a status read command "70h." That is, when the status read command "70h" is received, the semiconductor memory device 10 may read both the error correction flag and the shift read flag together with write pass/fail information.

In the present disclosure, an example is described in which the SLC scheme and the TLC scheme are applied to the writing of memory cells of the cache area and the storage area, respectively. But the present disclosure is not limited thereto, and aspects of the present disclosure can be adopted as long as the number of bits to be stored in the memory cells of the cache area is smaller than the number of bits to be stored in the memory cells of the storage area.

In the present disclosure, the particular assignment (arrangements) of the signal lines DQ outputting the status information is not limited thereto, and can be variously changed. In addition, the particular assignment of numerals/values of the error correction flag and the shift read flag is not limited to the specific examples provided, and can be variously changed.

In the present disclosure, "connection" indicates electrical connection, and includes not only direct connection but also connection via an arbitrary, intervening or interposed element or elements.

The memory cell array 11 may have a configuration in which memory cell transistors MT are laminated above a semiconductor substrate in a three-dimensional arrangement. Such a configuration is described, for example, in U.S. patent application Ser. No. 12/407,403, filed Mar. 19, 2009 as "Three dimensional stacked nonvolatile semiconductor memory". In addition, the configuration is described in U.S. patent application Ser. No. 12/406,524 filed Mar. 18, 2009 as "Three dimensional stacked nonvolatile semiconductor memory", U.S. patent application Ser. No. 12/679,991 filed Mar. 25, 2010 as "Non-volatile semiconductor storage device and method of manufacturing the same", and U.S. patent application Ser. No. 12/532,030 filed Mar. 23, 2009 as "Semiconductor memory and method for manufacturing same". The entire contents of these patent applications are incorporated herein by reference.

In the present, the block BLK need not be the erase unit of the data. For example, other erase operation is described in U.S. patent application Ser. No. 13/235,389 filed Sep. 18, 2011 as "Non-volatile semiconductor memory device", and U.S. patent application Ser. No. 12/694,690 filed Jan. 27, 2010 as "Non-volatile semiconductor memory device". The entire contents of these patent applications are incorporated herein by reference.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a semiconductor memory device including a memory cell array including a first area and a second area; and
a controller configured to cause first data to be written to the first area in response to an external command, the first data being stored in the first area as one-bit data, then to cause the first data to be transferred to the second area from the first area, the first data being stored in the second area as two or more bit data, wherein
during writing of the first data to the first area, an error check operation is performed on each page of the first data written to the first area, and a status value for each page of the first data written to the first area is stored in a register accessible by the controller, the status value indicating whether a number of error bits in each page of the first data stored in the first area exceeds a predetermined value, and
during transferring of the first data from the first area to the second area, the first data is read from the first area and then written to the second area in a process sequence selected by the controller according to the status value stored in the register for each page.

2. The memory system according to claim 1, wherein the status value corresponds to a setting of an error correction flag, and during transferring of the first data from the first area to the second area, each page of the first data having the error correction flag indicating error correction is required is corrected by an error correction code processing before being written to the second area, and each page having the error correction flag indicating error correction is not required is written to the second area without error correction code processing.

3. The memory system according to claim 2, wherein the controller is configured to perform the error correction code processing.

4. The memory system according to the claim 1, wherein the status value corresponds to a setting of a shift read flag, and during transferring of the first data from the first area to the second area, each page of first data having the shift read flag indicating a shift read is required is read from the first area with a first read voltage that is shifted from a second read voltage, and each page of first data having the shift read flag indicating the shift read is not required is read from the first area with the second read voltage.

5. The memory system according to claim 4, wherein the first read voltage is greater than the second read voltage.

6. The memory system according to claim 1, wherein the first data is stored in the second area as three-bit data.

7. The memory system according to claim 1, wherein the first area comprises at least a first memory block of the memory cell array, and the second area comprises at least a second memory block of the memory cell array.

* * * * *